United States Patent [19]
Tomishima

[11] Patent Number: 5,774,405
[45] Date of Patent: Jun. 30, 1998

[54] DYNAMIC RANDOM ACCESS MEMORY HAVING AN INTERNAL CIRCUIT USING A BOOSTED POTENTIAL

[75] Inventor: Shigeki Tomishima, Hyogo, Japan

[73] Assignee: Mitsubishi Denki Kabushiki Kaisha, Tokyo, Japan

[21] Appl. No.: 734,334

[22] Filed: Oct. 21, 1996

[30] Foreign Application Priority Data

Mar. 28, 1996 [JP] Japan .................................. 8-074647

[51] Int. Cl.$^6$ .................................................. G11C 7/00
[52] U.S. Cl. ...................... 365/226; 365/204; 365/185.25
[58] Field of Search ........................ 365/185.01, 230.01, 365/189.01, 226, 204, 185.25

[56] References Cited

U.S. PATENT DOCUMENTS 5,426,333  6/1995  Maeda ..................................... 327/536
5,499,209  3/1996  Oowaki et al. ..................... 365/189.11
5,587,958  12/1996  Kaneko et al. ..................... 365/230.06
5,642,313  6/1997  Ferris ................................. 365/185.25

FOREIGN PATENT DOCUMENTS 1-160059  6/1989  Japan .
5-189961  7/1993  Japan .
7-46825   2/1995  Japan .

Primary Examiner—Viet Q. Nguyen
Attorney, Agent, or Firm—McDermott, Will & Emery

[57] ABSTRACT

A second charge pump circuit generates a boosted potential at a second level required by a word driver. A first charge pump circuit generates a boosted potential at a first level required by a BLI driver. It is therefore not necessary to generate a boosted potential larger than necessary to BLI driver. As a result, unnecessary current consumption may be restrained and the circuit may be prevented from breaking down, resulting in improved reliability.

18 Claims, 22 Drawing Sheets

DYNAMIC RANDOM ACCESS MEMORY HAVING AN INTERNAL CIRCUIT USING A BOOSTED POTENTIAL

BACKGROUND OF THE INVENTION

1. Field of the Invention

The present invention relates to a dynamic random access memory (which will also be referred to as a "DRAM"), and in particular to a boosted potential generating circuit.

2. Description of the Background Art

Semiconductor memory devices (pseudo static random access memories, nonvolatile semiconductor memory devices) have been disclosed, e.g., in Japanese Patent Laying-Open Nos. 5-189961 (1993) and 1-160059 (1989).

FIG. 27 is a schematic block diagram fragmentarily showing a conventional DRAM.

Referring to FIG. 27, a conventional DRAM includes a boosted potential generating circuit which is formed of a ring oscillator 205, a detecting circuit 207 and a charge pump circuit 209. Detecting circuit 207 detects a potential level at a boosted potential node Npp, and activates ring oscillator 205 when boosted potential Vpp lowers below a predetermined level. Charge pump circuit 209 issues boosted potential Vpp to boosted potential node Npp in response to a clock signal CLK sent from ring oscillator 205. Detecting circuit 207 stops operation of ring oscillator 205 when the potential level at boosted potential node Npp increases to or above the predetermined level. Thereby, charge pump circuit 209 stops issuing of boosted potential Vpp to boosted potential node Npp. Boosted potential Vpp issued by charge pump circuit 209 to boosted potential node Npp is supplied to a BL1 driver 221 and a word driver 213. Boosted potential Vpp is higher in level than power supply potential Vcc. BLI driver 211 and word driver 213 are required by reasons which will be described below.

FIG. 28 is a circuit diagram specifically showing a memory cell in the conventional DRAM.

Referring to FIG. 28, the memory cell in the DRAM is formed of one NMOS transistor 215 and one capacitor 217. A gate electrode of NMOS transistor 215 is connected to a word line WL. One of source/drain electrodes of NMOS transistor 215 is connected to a bit line BL. The other of source/drain electrodes of NMOS transistor 215 is connected to one of electrodes of capacitor 217. If a P-type semiconductor substrate is employed, NMOS transistor 215 has a negative potential Vbb in many cases. The other electrode of capacitor 217 is at a cell plate potential Vcp. Cell plate potential Vcp is equal to a half (½Vcc) of power supply potential Vcc.

Description will be given on writing of data at "H" level (i.e., Vcc level) into the memory cell (storage node SN). A sense amplifier (not shown) supplies data at power supply potential Vcc level onto bit line BL. It is necessary to transmit this data at power supply potential Vcc level to storage node SN without an influence by a threshold voltage Vthm of NMOS transistor 215. Thus, NMOS transistor 215 must be turned on completely. For this purpose, boosted potential Vpp of or higher than Vcc+Vthm is required on word line WL. Word driver 213 is a circuit which uses boosted potential node Npp as a power supply and supplies boosted potential Vpp satisfying the above requirement onto word line WL.

FIG. 29 is a schematic block diagram showing another portion of the conventional DRAM.

In FIG. 29, the DRAM employs a shared sense amplifier structure. This is employed for reducing a layout region for sense amplifiers. Each of memory array blocks B1 and B2 includes a plurality of bit line pairs BLL and /BLL, and BLR and /BLR as well as a plurality of memory cells (not shown). Each of sense amplifier rows or groups 25 and 27 amplifies potential differences on bit line pairs. Memory array blocks B1 and B2 commonly use sense amplifier row 25. When memory array block B2 is selected, NMOS transistors 29 and 31 are turned off, and NMOS transistors 33 to 39 are turned on. Thereby, memory array block B2 uses sense amplifier rows 25 and 27. In this case, data at "H" level (i.e., power supply potential Vcc level) amplified, e.g., by sense amplifier row 25 for writing or rewriting must be transmitted onto bit line BLR without an influence by a threshold voltage Vthb of NMOS transistor 35. For this, a potential on a bit line isolating line BLI0R connected to a gate electrode of NMOS transistor 35 must be boosted potential Vpp of or higher than Vcc+Vthb. This is also true with respect to bit line isolating lines BLI0L and BLI1L. BLI driver 211 is a circuit, which uses boosted potential node Npp as a power supply and supplies boosted potential Vpp onto bit line isolating lines BLI0L, BLI0R and BLI1L.

In the conventional DRAM, as described above, single charge pump circuit 209 is used to supply boosted potential Vpp to BLI driver 211 (i.e., to bit line isolating lines BLI0L, BLI0R and BLI1L) and boosted potential Vpp to word driver 213 (i.e., to word line WL). Description will now be given on problems which arise in the case where the single charge pump supplies boosted potential Vpp to two kinds of drivers (BLI driver and word driver).

FIG. 30 is a circuit diagram specifically showing a memory cell for illustrating a first problem of the conventional DRAM. Portions similar to those in FIG. 28 bear the same reference numbers or characters, and will not be described below.

Referring to FIG. 30, writing of data at "H" level (i.e., power supply potential Vcc level) into a memory cell will be described below. Bit line BL has received data at power supply potential Vcc level from a sense amplifier (not shown). The following description will be given on the case where word line WL is activated (i.e., set to "H" level), and data at power supply potential Vcc level is to be written into storage node SN of capacitor 217. When bit line BL (source S of NMOS transistor 215) attains power supply potential Vcc level, a back gate potential Vbs of a large value of |Vbb−Vcc| is produced across source S and the substrate, because substrate potential Vbb has been applied to NMOS transistor 215. In general, a threshold voltage Vphm of NMOS transistor 215 of the memory cell is set higher than a threshold voltage of an NMOS transistor used in a circuit such as a peripheral circuit other than the memory cell in order to improve good refreshing characteristics by reducing a subthreshold current. Threshold voltage Vthm of NMOS transistor of the memory cell, which is high for the above reasons, further increases if back gate potential Vbs increases due to rising of a potential on source S of NMOS transistor 215.

FIG. 31 shows a relationship between back gate potential Vbs and threshold voltage Vthm of the NMOS transistor used in the memory cell for illustrating the first problem of the conventional DRAM. The abscissa gives the back gate potential Vbs, and the ordinate gives the threshold voltage Vthm.

Referring to FIG. 31, when the back gate potential Vbs is equal to |Vbb|, the threshold voltage takes on the value of Vthm1. When source S of NMOS transistor 215 in FIG. 30 attains power supply potential Vcc (i.e., when data at power supply potential Vcc level is to be written), the back gate potential takes on |Vbb−Vcc|, so that the threshold voltage of NMOS transistor 215 in FIG. 30 takes on Vthm2. When data at power supply potential Vcc level is to be written into the memory cell, the threshold voltage is higher by ΔVthm than that in the case where data at ground potential GND level is to be written.

As shown in FIG. 29, NMOS transistors 29–39 connected to bit line isolating lines BLI0L, BLI0R and BLI1L are NMOS transistors generally used for a peripheral circuitry. Therefore, threshold voltage Vthb of NMOS transistors 29–39 connected to bit line isolating lines is lower than threshold voltage Vthm of NMOS transistors used for memory cells. This means that the potential level of boosted potential Vpp supplied to bit line isolating lines BLI0L, BLI0R and BLI1L can be lower than that of boosted potential Vpp supplied to word line WL.

From the foregoing, the first problem can be understood as follows. As shown in FIG. 27, when single charge pump circuit 209 supplies boosted potential Vpp to two kinds of drivers (BL1 driver 211 and word driver 213), boosted potential Vpp at the same potential level is supplied from BL1 driver 211 and word driver 213 to bit line isolating lines BLI0L, BLI0R and BLI1L and word line WL, respectively. Therefore, the potential level of boosted potential Vpp is set based on word line WL, which requires a higher potential level than bit line isolating lines BLI0L, BLI0R and BLI1L. Thus, NMOS transistors 29–39, of which gates are connected to bit line isolating lines BLI0L, BLI0R and BLI1L, are supplied with boosted potential Vpp at an unnecessarily high level. This results in waste of a current, and deterioration in reliability of NMOS transistors 29–39.

A second problem of the conventional DRAM will be described below. The second problem arises in the DRAM of a low power supply potential, e.g., of 2V or less.

FIG. 32 is a circuit diagram showing a general boosted potential generating circuit for illustrating the second problem of the conventional DRAM.

Referring to FIG. 32, the conventional boosted potential generating circuit includes diodes 219 and 221, a capacitor 225 and an oscillator 223. Diode 219 which operates as a precharge circuit supplies power supply potential Vcc to a node NA for precharging node NA. Therefore, one of electrodes of capacitor 225 connected to node NA is charged. After precharging, oscillator 223 changes the potential on the other electrode of capacitor 225 from ground potential GND level to power supply potential Vcc level. Thus, oscillator 223 produces a clock signal having an amplitude of (GND-Vcc). When the other electrode of capacitor 225 is supplied with a clock signal at power supply potential Vcc level, the potential on node NA is boosted to the double, i.e., 2Vcc level. Diode 221 operating as a switch element transmits this potential at 2Vcc level to boosted potential node Npp. In this manner, the boosted potential generating circuit generates boosted potential Vpp on boosted potential node Npp.

As described above, the maximum potential level of the boosted potential which the general boosted potential generating circuit can generate is double the level of power supply potential Vcc, even if the boosted potential generating circuit is an ideal circuit. Therefore, if the power supply potential Vcc is small and 2V or less, boosted potential Vpp supplied to word line WL (FIG. 28) is small. Therefore, when data at power supply potential Vcc level is to be written into a memory cell, this writing is influence by threshold voltage Vthm of NMOS transistor 215 (FIG. 28) forming the memory cell. The reason of this disadvantage will be described below more in detail.

FIG. 33 shows, for illustrating a second problem of the conventional DRAM, a relationship between power supply potential Vcc and the maximum boosted potential Vpp which can be generated from the boosted potential generating circuit in FIG. 32. The abscissa gives power supply potential Vcc, and the ordinate gives boosted potential Vpp.

Referring to FIG. 33, line d represents power supply potential Vcc level. Thus, the ordinate in FIG. 33 represents power supply potential Vcc with respect to line d. Here, it is impossible to lower threshold voltage Vthm of NMOS transistor 215 (FIG. 28) of the memory cell with the same gradient as power supply potential Vcc. Thus, threshold voltage Vthm takes on the constant value regardless of power supply potential Vcc. Therefore, the minimum potential level which boosted potential Vpp requires has the same gradient as power supply potential Vcc. Line c represents the minimum potential level which boosted potential Vpp requires.

In a practical case, the minimum potential level which boosted potential Vpp requires must be calculated by adding to a value of (Vcc+Vthm) an operation margin m2 (a fraction of 1 volt) and a control margin m1 (a fraction of 1 volt) required for controlling detecting circuit 207 (FIG. 28). Line b represents the practically required minimum potential level of boosted potential Vpp. Threshold voltage Vthm of the NMOS transistor used in the memory cell cannot be lowered with the same gradient as power supply potential Vcc, because the refresh characteristics must be ensured. Control margin m1 is required in order to prevent frequent operation of charge pump circuit 209 (FIG. 28) which increases a current consumption. From the foregoing, it is understood that the practically required minimum potential level of boosted potential Vpp is Vcc+Vthm+m1+m2 (line b in FIG. 33).

Maximum boosted potential Vpp which the boosted potential generating circuit (FIG. 32) can generate rapidly lowers with lowering of power supply potential Vcc. Line a in FIG. 33 represents the maximum potential level of boosted potential Vpp which the boosted potential generating circuit (FIG. 32) can generate.

The rapid lowering is caused by the fact that the maximum boosted potential Vpp, which the boosted potential generating circuit (FIG. 32) can generate, is 2Vcc and therefore has double the gradient of power supply potential Vcc. When power supply potential Vcc is Vb and therefore large, the level (line a) of maximum boosted potential Vpp from the boosted potential generating circuit (FIG. 32) exceeds the actually required level (line b) of the boosted potential Vpp, so that no problem arises. However, when power supply potential Vcc is not higher than Va, and is small (e.g., 2V or less), a problem arises. More specifically, when power supply potential Vcc is Va, the maximum level of boosted potential Vpp from the boosted potential generating circuit (FIG. 32) is equal to the actually required minimum level of boosted potential Vpp. When power supply potential Vcc is lower than Va, the maximum level of boosted potential Vpp from the boosted potential generating circuit (FIG. 32) is smaller than the actually required minimum level of boosted potential Vpp. Therefore, if the power supply potential is small, the boosted potential generating circuit in FIG. 32 cannot supply the actually required boosted potential Vpp. The foregoing is the first disadvantage. The second disadvantage will be described below.

FIG. 34 shows a power supply for boosted potential Vpp for illustrating the second problem of the conventional DRAM. Portions similar to those in FIG. 32 bear the same reference numbers or characters, and will not be described below. A switch 227 in FIG. 34 corresponds to diode 221 in FIG. 32.

Assuming that a capacitor 229 in FIG. 34 has a capacitance of Cv, capacitor 229 can accumulate charges of Cv·Vpp. In this sense, a boosted potential node Npp connected to capacitor 229 is a power supply for supplying boosted potential Vpp.

During one operation cycle, power supply Npp consumes a constant quantity of charges, i.e., Cv·Vpp. Therefore, if the consumed charges were not supplemented by the boosted potential generating circuit (diode 219, capacitor 225, oscillator 223 and switch 227) as indicated by an arrow a during one cycle, the potential level of boosted potential Vpp would be low at the start of the next cycle, which might cause malfunction. The quantity of charges which can be supplemented by the boosted potential generating circuit is equal to Cp·(2Vcc−Vpp) where Cp represents a capacitance of capacitor (pump capacitor) 225. If a value of (2Vcc−Vpp) were small, i.e., if there were only a small difference between the attainable maximum potential level of the boosted potential from the boosted potential generating circuit and the required minimum potential level of the boosted potential, the value of capacitance of capacitor (pump capacitor) 225 would be extremely large, resulting in unpreferably increase in chip size. This is the second disadvantage.

The following may be a kind of measures for overcoming the first and second disadvantages. In such a case that a low power supply potential Vcc of 2V or less is used in a DRAM, the DRAM employs a boosted potential generating circuit which can generate the boosted potential larger than double the power supply potential Vcc, if the potential level of double the power supply potential Vcc is not enough for the producible maximum boosted potential Vpp of the boosted potential generating circuit. This boosted potential generating circuit is specifically disclosed in Japanese Patent Laying-Open No. 7-46825.

However, if the DRAM employs the boosted potential generating circuit which can generate the boosted potential at a level larger than double the power supply potential Vcc level, the following problem arises when the boosted potential Vpp at the level of or above double the power supply potential Vcc level is issued from the single charge pump circuit 209 to BL1 driver 211 and word driver 213 (FIG. 28). In this case, word line WL (FIG. 28) as well as bit line isolating lines BLI0L, BLI0R and BLI1L (FIG. 29) are also supplied with the boosted potential Vpp at the level of or above double the power supply potential Vcc level. Therefore, word line WL (FIG. 28) can be supplied with the required potential, i.e., boosted potential Vpp equal to or higher than double the power supply potential Vcc, but NMOS transistors (bit line isolating transistors) 29–39 in FIG. 29 are supplied with boosted potential Vpp at the unnecessarily high level. This results in reduction of reliability of NMOS transistors (bit line isolating transistors) 29–39 in FIG. 29, and also results in waste of a current. The foregoing is the second problem.

SUMMARY OF THE INVENTION

An object of the invention is to overcome the above first and second problems, and particularly to provide a DRAM which can suppress waste of a current and has improved reliability.

A dynamic random access memory according to a first aspect of the invention includes a plurality of internal circuits, a plurality of boosted potential supply lines, and a plurality of boosted potential generating circuits. The plurality of boosted potential supply lines are provided corresponding to the plurality of internal circuits. Each boosted potential supply line supplies a boosted potential to a corresponding internal circuit. The plurality of boosted potential generating circuits are provided corresponding to the plurality of internal circuits. Each boosted potential generating circuit generates a boosted potential to be applied to a corresponding boosted potential supply line. The boosted potential generating circuit generates a boosted potential such that the potential level of the corresponding boosted potential supply line attains a level corresponding to the corresponding internal circuit.

As described above, in the dynamic random access memory according to the first aspect of the invention, the plurality of boosted potential supply lines and the plurality of boosted potential generating circuits are provided corresponding to the plurality of internal circuits. Therefore, the operation of a boosted potential generating circuit is free from the influence of the operation of internal circuits other than a corresponding internal circuit.

In addition, in the dynamic random access memory according to the first aspect of the invention, the boosted potential generation circuit generates a boosted potential corresponding to the level of the corresponding internal circuit. Therefore, it is not necessary to generate a boosted potential larger than necessary, and unnecessary consumption of current may be restrained. Furthermore, a boosted potential larger than necessary will not be applied to circuit elements, resulting in increased reliability.

A dynamic random access memory according to a second aspect of the invention has a plurality of operation modes. The dynamic random access memory includes a first internal circuit, a first boosted potential supply line, and a first boosted potential generating circuit. The first boosted potential supply line supplies a first boosted potential to a first internal circuit. The first boosted potential generating circuit generates the first boosted potential to be applied to the first boosted potential supply line. The first boosted potential generating circuit generates the first boosted potential such that the first boosted potential supply line attains a potential level corresponding to the first internal circuit. The first boosted potential generating circuit includes a first power supply potential detecting circuit for detecting the level of power supply potential. The capability of the first boosted potential generating circuit is switched in response to a detection result by the first power supply potential detecting circuit irrespectively of the plurality of operation modes.

As described above, in the dynamic random access memory according to the second aspect of the invention, the capability of the first boosted potential generating circuit is switched in response to the power supply potential. As a result, for a small power supply potential, the capability of the first boosted potential generating circuit may be increased. Thus, if the power supply potential is small, the first boosted potential at a level required by the first internal circuit may be generated based on the power supply potential. Meanwhile, for a large power supply potential, the capability of the first boosted potential generating circuit may be reduced. Thus, the first boosted potential larger than necessary may be prevented from being generated, and therefore unnecessary consumption of current may be restrained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A DRAM of the invention will be described below with reference to the drawings.

(Embodiment 1)

Figure 1:
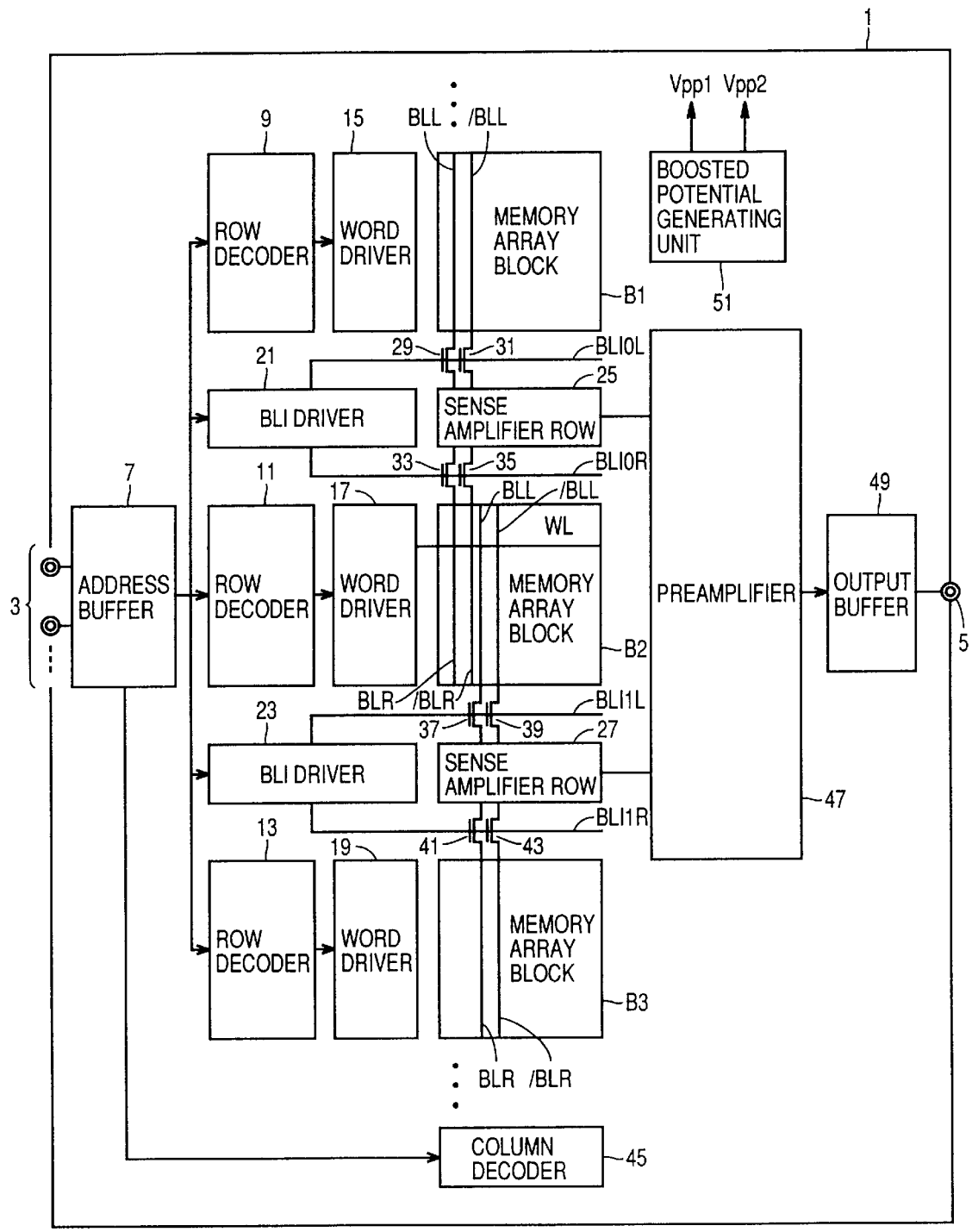
FIG. 1 is a schematic block diagram showing a whole structure of an embodiment 1 of the invention.

FIG. 1 is a schematic block diagram showing a whole structure of a DRAM of an embodiment 1 of the invention.

Referring to FIG. 1, the DRAM is formed on a semiconductor substrate 1. The DRAM includes an address signal input terminal group 3, an output pin 5, an address buffer 7, row decoders 9, 11 and 13, word drivers 15, 17 and 19, BL1 drivers 21 and 23, sense amplifier rows or groups 25 and 27, NMOS transistors (bit line isolating transistors) 29, 31, 33, 35, 37, 39, 41 and 43, a column decoder 45, a preamplifier 47, an output buffer 49, a boosted potential generating unit 51 and memory array blocks B1, B2 and B3. In FIG. 1, " . . . " represents repetitive arrangement.

It is assumed that memory array block B2 is selected. In this case, sense amplifier row 25 is isolated from bit line pair BLL and /BLL by NMOS transistors 29 and 31. Sense amplifier row 25 is connected to bit line pair BLR and /BLR by NMOS transistors 33 and 35. Sense amplifier row 27 is isolated from bit line pair BLR and /BLR by NMOS transistors 41 and 43. Sense amplifier row 27 is connected to bit line pair BLL and /BLL by NMOS transistors 37 and 39.

In this case, NMOS transistors 29, 31, 41 and 43 are off. NMOS transistors 33 and 35 receive on their gates a boosted potential Vpp1 supplied from BLI driver 21, and thereby are turned on. BLI driver 21 receives, as a power supply potential, boosted potential Vpp1 from boosted potential generating unit 51, and supplies boosted potential Vpp1 to NMOS transistors 33 and 35. NMOS transistors 37 and 39 receive, on their gates, boosted potential Vpp1 from BLI driver 23, and thereby are turned on. BLI driver 23 receives, as a power supply potential, boosted potential Vpp1 from boosted potential generating unit 51, and supplies boosted potential Vpp1 to NMOS transistors 37 and 39.

An address signal supplied through address signal input terminal group 3 is sent, as a row address signal, to row decoder 11 via address buffer 7. The row address signal is decoded by row decoder 11, and then is used in word driver 17 activating word lines WL. Word driver 17 activates word line WL designated by the row address signal. More specifically, word driver 17 applies a boosted potential Vpp2 to word line WL designated by the row address signal. Word driver 17 uses, as a power supply potential, boosted potential Vpp2 supplied from boosted potential generating unit 51, and supplies boosted potential Vpp2 to word line WL. A column address signal, which is supplied in a timeshared manner after taking in the row address signal, is supplied to column decoder 45. Column decoder 45 activates a column select line (not shown) after decoding the column address signal. Data of a memory cell, which is selected by both the word line WL and column select line (not shown), is amplified by sense amplifier row 25 or 27, and is externally sent from output pin 5 through preamplifier 47 and output buffer 49. Memory array block B2 includes a plurality of memory cells arranged in a matrix form. Row decoders 9 and 13 are similar to row decoder 11. Word drivers 15 and 19 are similar to word driver 17. Memory array blocks B1 and B3 are similar to memory array block B2. Although reading has been described, writing can be performed. The distinctive feature of the DRAM of the embodiment 1 is boosted potential generating unit 51.

In addition, the DRAM has a plurality of operation modes such as usual reading/writing operation, stand-by state and battery backup modes.

Figure 2:
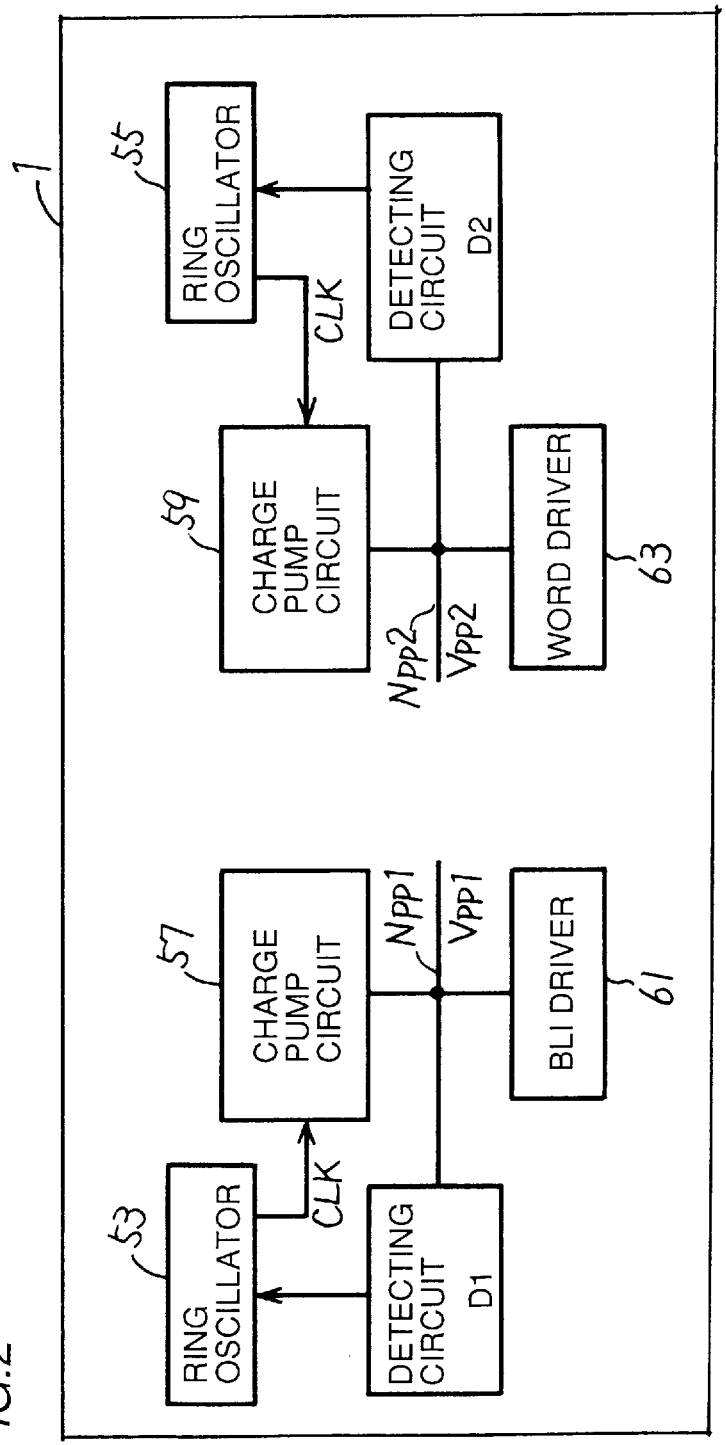
FIG. 2 is a schematic block diagram fragmentarily showing the DRAM of the embodiment 1 of the invention.

FIG. 2 is a schematic block diagram fragmentarily showing the DRAM in FIG. 1, and mainly shows boosted potential generating unit 51 in FIG. 1. Portions similar to those in FIG. 1 bear the same reference numbers or characters and will not be described below. Referring to FIG. 2, the boosted potential generating unit in FIG. 1 includes a first boosted potential generating unit 51 which is formed of a detecting circuit D1, a ring oscillator 53 and a charge pump circuit 57, and a second boosted potential generating circuit which is formed of a detecting circuit D2, a ring oscillator 55 and a charge pump circuit 59. A BLI driver 61 corresponds to BLI drivers 21 and 23 in FIG. 1. Word driver 63 corresponds to word drivers 15, 17 and 19 in FIG. 1.

An operation will be described below. Detecting circuit D1 detects a potential level on boosted potential node (line supplying a boosted potential Vpp1 to BLI driver 61) Npp1, and activates ring oscillator 53 when boosted potential Vpp1 decreases below a first level. When boosted potential Vpp1 increases above the first level, detecting circuit D1 stops the operation of ring oscillator 53. When boosted potential Vpp1 decreases below the first level, charge pump circuit 57 issues boosted potential Vpp1 to boosted potential node Npp1 based on a clock signal CLK sent from ring oscillator 53. The first level, which is a reference for detection in detecting circuit D1, is set to maintain the potential level of boosted potential Vpp1 required by BLI driver 61.

Detecting circuit D2 detects a potential level on boosted potential node (line supplying a boosted potential Vpp2 to word driver 63) Npp2, and activates ring oscillator 55 when boosted potential Vpp2 decreases below a second level. When boosted potential Vpp2 increases above the second level, detecting circuit D2 stops the operation of ring oscillator 55. When boosted potential Vpp2 decreases below the second level, charge pump circuit 59 issues boosted potential Vpp2 to boosted potential node Npp2 based on clock signal CLK sent from ring oscillator 55. The second level, which is a reference for detection in detecting circuit D2, is set to maintain the potential level of boosted potential Vpp2 required by word driver 63.

Charge pump circuits 57 and 59 have similar structures. The first level, which is the reference for detection in detecting circuit D1, is smaller than the second level, which is the reference for detection in detecting circuit D2. Therefore, boosted potential Vpp1 is smaller than boosted potential Vpp2.

As described above, the DRAM of the embodiment 1 is provided with the two different potential generating circuits (i.e., potential generating circuits shown at the left and right portions in FIG. 2) which generate the boosted potentials (Vpp1 and Vpp2) at the different levels. Therefore, BLI driver 61 can be supplied with boosted potential Vpp1 at the level required by BLI driver 61, i.e., boosted potential Vpp1 at the level which can prevent an influence by threshold voltages of NMOS transistors 29 to 43 (FIG. 1) at the time of turn-on of them. Meanwhile, word driver 63 can be supplied with boosted potential Vpp2 at the level required by word driver 63, i.e., boosted potential Vpp2 at the level which can prevent an influence by threshold voltages of NMOS transistors forming memory cells at the time of turn-on of them.

Therefore, it is not necessary to set all the boosted potentials to the high potential level required by the word driver in contrast to the case where a single boosted potential generating circuit supplies boosted potentials to both the BLI driver and the word driver. In the DRAM of the embodiment 1, therefore, boosted potential Vpp1 at a necessary level can be supplied to BLI driver 61, and in other words, boosted potential Vpp1 at an unnecessarily large level is not supplied to BLI driver 61, so that waste of a current can be suppressed.

In the DRAM of the embodiment 1, BLI driver 61 does not apply an unnecessary large boosted potential Vpp1 to NMOS transistors (bit line isolating transistors) 29 to 43 (FIG. 1), so that destruction of circuits can be prevented, and reliability can be improved.

In the DRAM of the embodiment 1, the first boosted potential generating circuit is provided for BLI driver 61, and the second boosted potential generating circuit is provided for word driver 63. Therefore, the operation of the first boosted potential generating circuit is not influenced by the operation of word driver 63, and the operation of the second boosted potential generating circuit is not influenced by the operation of BLI driver 61.

Figure 3:
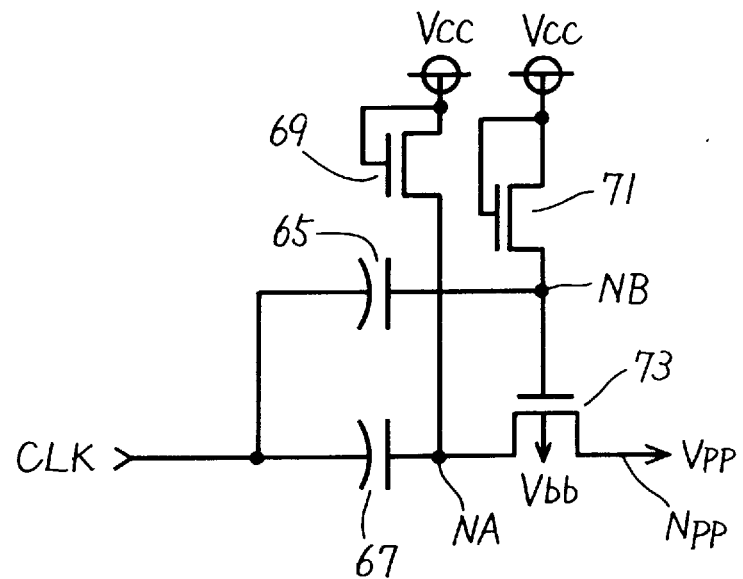
FIG. 3 is a circuit diagram specifically showing a charge pump circuit in FIG. 2.

FIG. 3 is a circuit diagram specifically showing charge pump circuits 57 and 59 in FIG. 2. Boosted potential node Npp in FIG. 3 is boosted potential node Npp1 or Npp2 in FIG. 2. Boosted potential Vpp generated on boosted potential node Npp in FIG. 3 is boosted potential Vpp1 or Vpp2 in FIG. 2.

Referring to FIG. 3, the charge pump circuit includes capacitors 65 and 67 as well as NMOS transistors 69, 71 and 73. Capacitor 67 is connected between a node NA and a node supplied with clock signal CLK. Capacitor 65 is connected between a node NB and the node supplied with clock signal CLK. NMOS transistor 73 is connected between node NA and boosted potential node Npp, and has a gate connected to node NB. NMOS transistor 69 is connected between node NA and a node having power supply potential Vcc. NMOS transistor 71 is connected to node NB and the node having power supply potential Vcc. Clock signal CLK is of a pulse type.

An operation will be described below. Before the operation, nodes NA and NB are precharged to attain a potential which is equal in level to power supply potential Vcc or is lower by a threshold voltage than power supply potential Vcc. This precharging is performed by NMOS transistors 69 and 71. Capacitors 65 and 67 are supplied with clock signal CLK. When the potential of clock signal rises from ground potential GND (0V) to power supply potential Vcc, the potentials on nodes NA and NB are raised by capacity coupling from power supply potential Vcc level to the double, i.e., 2Vcc level. The potential at 2Vcc level on node NA is supplied as boosted potential Vpp to boosted potential node Npp through NMOS transistor 73. Since the final driver of the charge pump circuit is NMOS transistor 73, the potential at the level which lowers by threshold voltage Vthn of NMOS transistor 73 from 2Vcc is supplied to boosted potential node Npp.

Figure 4:
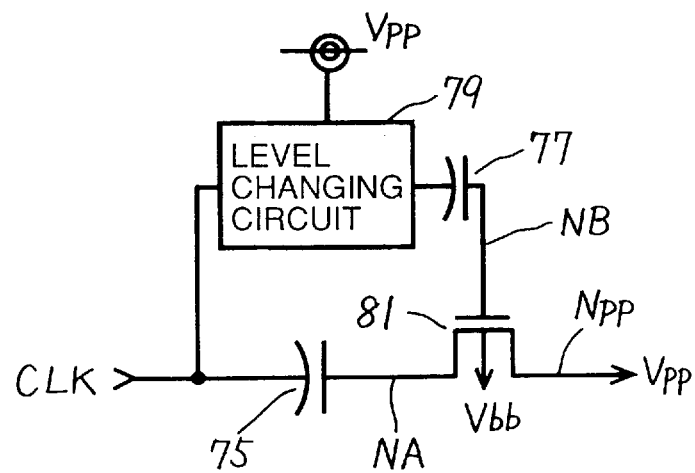
FIG. 4 is a circuit diagram specifically showing another example of the charge pump circuit in FIG. 2.

FIG. 4 is a circuit diagram specifically showing another example of charge pump circuits 57, 59 in FIG. 2. Boosted potential node Npp in FIG. 4 is boosted potential node Npp1 or Npp2 in FIG. 2. Boosted potential Vpp in FIG. 4 is boosted potential Vpp1 or Vpp2 in FIG. 2.

Referring to FIG. 4, the charge pump circuit includes capacitors 75 and 77, a level changing circuit 79 and an NMOS transistor 81.

Capacitor 75 is connected between node NA and the node supplied with clock signal CLK. Level changing circuit 79 widens the amplitude of clock signal CLK, and sends the same to capacitor 77. Capacitor 77 is connected between level changing circuit 79 and node NB. NMOS transistor 81 is connected between node NA and boosted potential node Npp.

The charge pump circuit having the above structure is provided for generating boosted potential Vpp at a higher level than that by the charge pump circuit in FIG. 3. More specially, its purpose is to establish such a relationship that the potential level supplied to the gate of NMOS transistor 81 is higher than the potential level (2Vcc level) supplied to the gate of NMOS transistor 73 in FIG. 3, and thereby to prevent the potential supplied from node NA to boosted potential node Npp from lowering from 2Vcc by threshold voltage Vthn.

Figure 5:
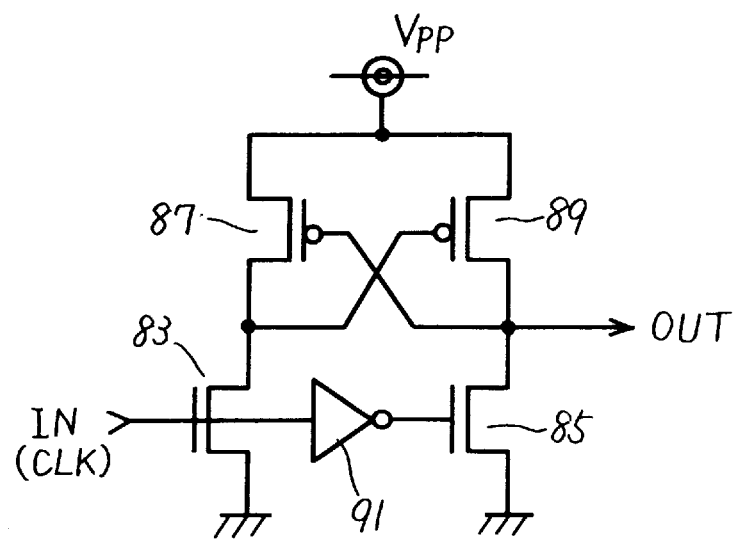
FIG. 5 is a circuit diagram specifically showing a level changing circuit in FIG. 4.

FIG. 5 is a circuit diagram specifically showing level changing circuit 79 in FIG. 4. Portions similar to those in FIG. 4 bear the same reference numbers or characters, and will not be described below.

Referring to FIG. 5, the level changing circuit includes NMOS transistors 83 and 85, PMOS transistors 87 and 89, and an inverter 91. PMOS transistor 87 and NMOS transistor 83 are connected in series between a node having boosted potential Vpp and a node having ground potential GND. PMOS transistor 89 and NMOS transistor 85 are connected in series between the node having boosted potential Vpp and the node having ground potential GND. Clock signal CLK which is an input signal IN is supplied to a gate of NMOS transistor 83. Clock signal CLK inverted by inverter 91 is supplied to a gate of NMOS transistor 85. PMOS transistor 89 has a gate connected to a drain of NMOS transistor 83. PMOS transistor 87 has a gate connected to a drain of NMOS transistor 85. An output signal OUT is sent from a drain of NMOS transistor 85 to capacitor 77 in FIG. 4.

Referring to FIGS. 4 and 5, an operation of the charge pump circuit will be described below. When level changing circuit 79 is supplied with clock signal CLK at ground potential GND level, level changing circuit 79 issues signal OUT at ground potential GND level to capacitor 77. When clock signal CLK changes from ground potential GND level to power supply potential Vcc level, level changing circuit 79 issues signal OUT at boosted potential Vpp level to capacitor 77. Since capacitor 77 is supplied with boosted potential Vpp, the potential on node NB increases to a level above 2Vcc owing to the capacity coupling. Therefore, the potential at 2Vcc level on node NA can be sent, as boosted potential Vpp, to boosted potential node Npp without an influence by threshold voltage Vthn of NMOS transistor 81. Thus, the potential sent to boosted potential node Npp does not lower from 2Vcc by threshold voltage Vthn.

Figure 6:
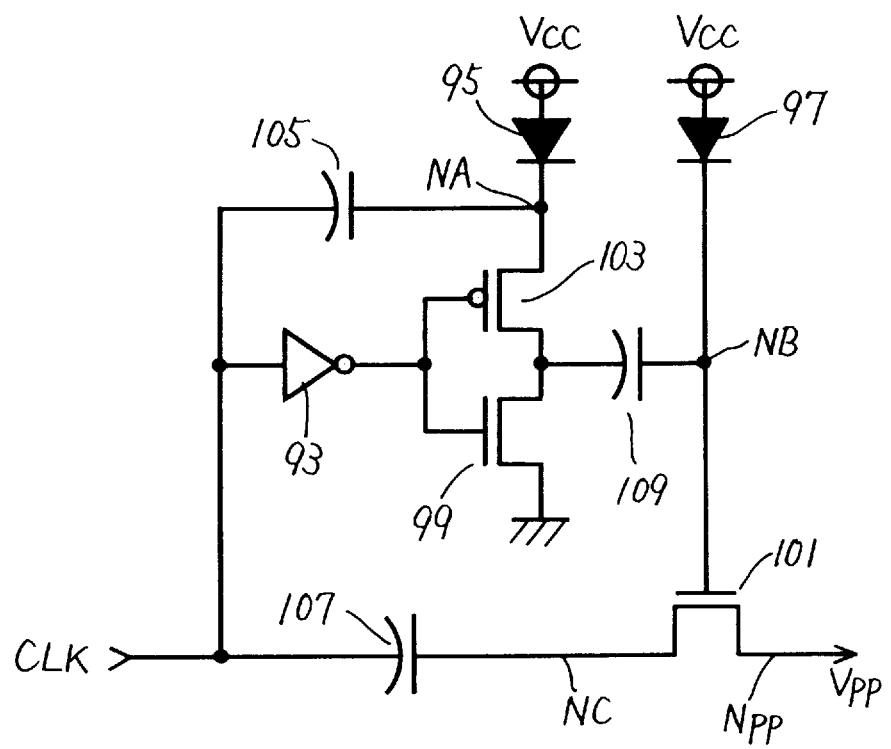
FIG. 6 is a circuit diagram specifically showing still another example of the charge pump circuit in FIG. 2.

FIG. 6 is a circuit diagram specifically showing still another example of charge pump circuits 57 and 59 in FIG. 2. Boosted potential node Npp in FIG. 6 is boosted potential node Npp1 or Npp2 in FIG. 2. Boosted potential Vpp in FIG. 6 is boosted potential Vpp1 or Vpp2 in FIG. 2.

Referring to FIG. 6, the charge pump circuit includes an inverter 93, diodes 95 and 97, NMOS transistors 99 and 101, a PMOS transistor 103, and capacitors 105, 107 and 109. Capacitor 107 is connected between a node NC and a node supplied with clock signal CLK. NMOS transistor 101 is connected between node NC and boosted potential node Npp, and has a gate connected to node NB. An input node of inverter 93 is connected to an input node for clock signal CLK. An output node of inverter 93 is connected to gates of PMOS and NMOS transistors 103 and 99. Diode 95, PMOS transistor 103 and NMOS transistor 99 are connected in series between the node having power supply potential Vcc and the node having ground potential GND. Capacitor 105 is connected between the input node for clock signal CLK and node NA. Capacitor 109 is connected between a drain of NMOS transistor 99 and node NB. Diode 97 is connected between node NB and the node having power supply potential Vcc.

Figure 7:
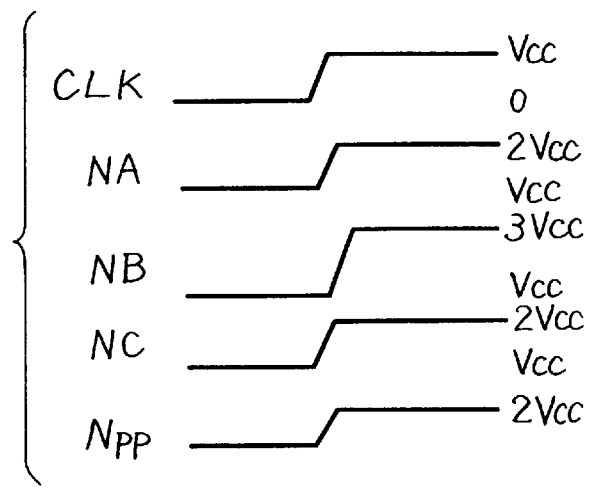
FIG. 7 is a timing chart showing an operation of a charge pump circuit in FIG. 6.

FIG. 7 is a timing chart showing an operation of the charge pump circuit in FIG. 6.

Referring to FIGS. 6 and 7, an operation of the charge pump circuit will be described below. Node NA has been charged to power supply potential Vcc level by diode 95 serving as a precharge circuit. When clock signal CLK changes from 0V to power supply potential Vcc, the potential on node NA attains double the power supply potential Vcc level, i.e., 2Vcc level owing to the capacity coupling. Meanwhile, PMOS transistor 103 is turned on, because the potential of 0V is supplied to its gate. Therefore, the potential at 2Vcc level is applied from node NA to capacitor 109. This and preceding operations correspond to widening of an amplitude of clock signal CLK, which has a magnitude between ground potential GND (0V) and power supply potential Vcc, to a magnitude between ground potential GND (0V) and 2Vcc. Since the capacitor 109 is supplied with a potential at 2Vcc level, the potential on node NB rises from power supply potential Vcc level to the triple, i.e., 3Vcc. The potential at 2Vcc level on node NC provided by capacitor 107 is supplied to boosted potential node Npp without lowering by threshold voltage Vthn of NMOS transistor 101 due to NMOS transistor 101 receiving on its gate the potential of 3Vcc.

Figure 8:
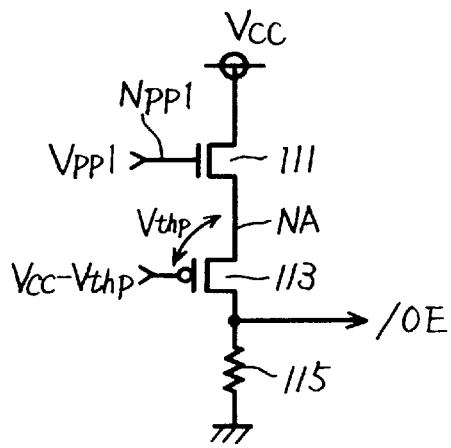
FIG. 8 is a circuit diagram specifically showing a detecting circuit D1 in FIG. 2.

FIG. 8 is a circuit diagram specifically showing detecting circuit D1 in FIG. 2.

Referring to FIG. 8, detecting circuit D1 includes an NMOS transistor 111, a PMOS transistor 113 and a resistor element 115. NMOS transistor 111, PMOS transistor 113 and resistor element 115 are connected in series between a node having power supply potential Vcc and a node having ground potential GND. NMOS transistor 111 has a gate connected to boosted potential node Npp1 in FIG. 2. NMOS transistor 111 receives boosted potential Vpp1 on its gate. NMOS transistor 111 is similar to that used in a memory cell. The threshold voltage of NMOS transistor 111 is represented by Vthm, and the threshold voltage of PMOS transistor 113 is represented by Vthp.

An operation will be described below. PMOS transistor 113 is supplied on its gate with a potential of Vcc−Vthp. Thereby, node NA is at power supply potential Vcc level. Therefore, NMOS transistor 111 is turned on, when boosted potential Vpp1 is larger than Vcc+Vthm (Vpp1>Vcc+ Vthm). Therefore, the detecting circuit issues a pump deactivating signal /OE at "H" level to ring oscillator 53 in FIG. 2. Pump deactivating signal /OE at "H" level deactivates ring oscillator 53 in FIG. 2, and thereby charge pump circuit 57 stops, so that boosted potential Vpp1 is generated no longer.

When boosted potential Vpp1 is not higher than Vcc+Vthm, NMOS transistor 111 is off. Therefore, the detecting circuit issues pump deactivating signal /OE at "L" level to ring oscillator 53 in FIG. 2. In response to pump deactivating signal /OE at "L" level, ring oscillator 53 in FIG. 2 starts its operation, and charge pump circuit 57 issues boosted potential Vpp1. Detecting circuit D1 serves to maintain boosted potential Vpp1 at Vcc+Vthm.

Figure 9:
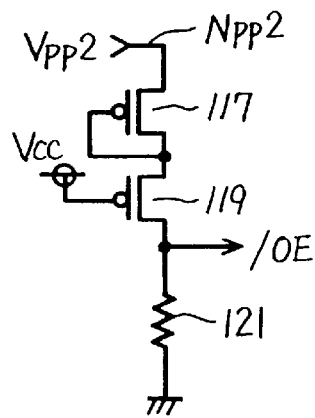
FIG. 9 is a circuit diagram specifically showing a detecting circuit D2 in FIG. 2.

FIG. 9 is a circuit diagram specifically showing detecting circuit D2 in FIG. 2.

Referring to FIG. 9, detecting circuit D2 includes PMOS transistors 117 and 119, and a resistor element 121. PMOS transistors 117 and 119, and resistor element 121 are connected in series between boosted potential node Npp2 in FIG. 2 and a node having ground potential GND. PMOS transistor 117 is diode-connected. PMOS transistor 119 receives power supply potential Vcc on its gate. Threshold voltages of PMOS transistors 117 and 119 are represented by Vthp. In the detecting circuit D2 having the above structure, pump deactivating signal /OE at "H" level is issued to ring oscillator 55 in FIG. 2 when boosted potential Vpp2 exceeds Vcc+2Vthp (Vpp2>Vcc+2Vthp). In response to pump deactivating signal /OE at "H" level, ring oscillator 55 stops its operation, so that charge pump circuit 59 stops issuance of boosted potential Vpp2. When boosted potential Vpp2 is lower than Vcc+2Vthp, detecting circuit D2 issues pump deactivating signal /OE at "L" level to ring oscillator 55 in FIG. 2. In response to pump deactivating signal /OE at "L" level, ring oscillator 55 starts its operation, so that charge pump circuit 59 issues boosted potential Vpp2.

According to the DRAM of the embodiment 1, as described above, it is possible to supply the boosted potentials at levels which are required by the BLI driver and word driver, respectively. Therefore, it is not necessary to generate an unnecessarily large boosted potential, so that waste of a current is prevented, and reliability is not impaired.

(Embodiment 2)

Figure 10:
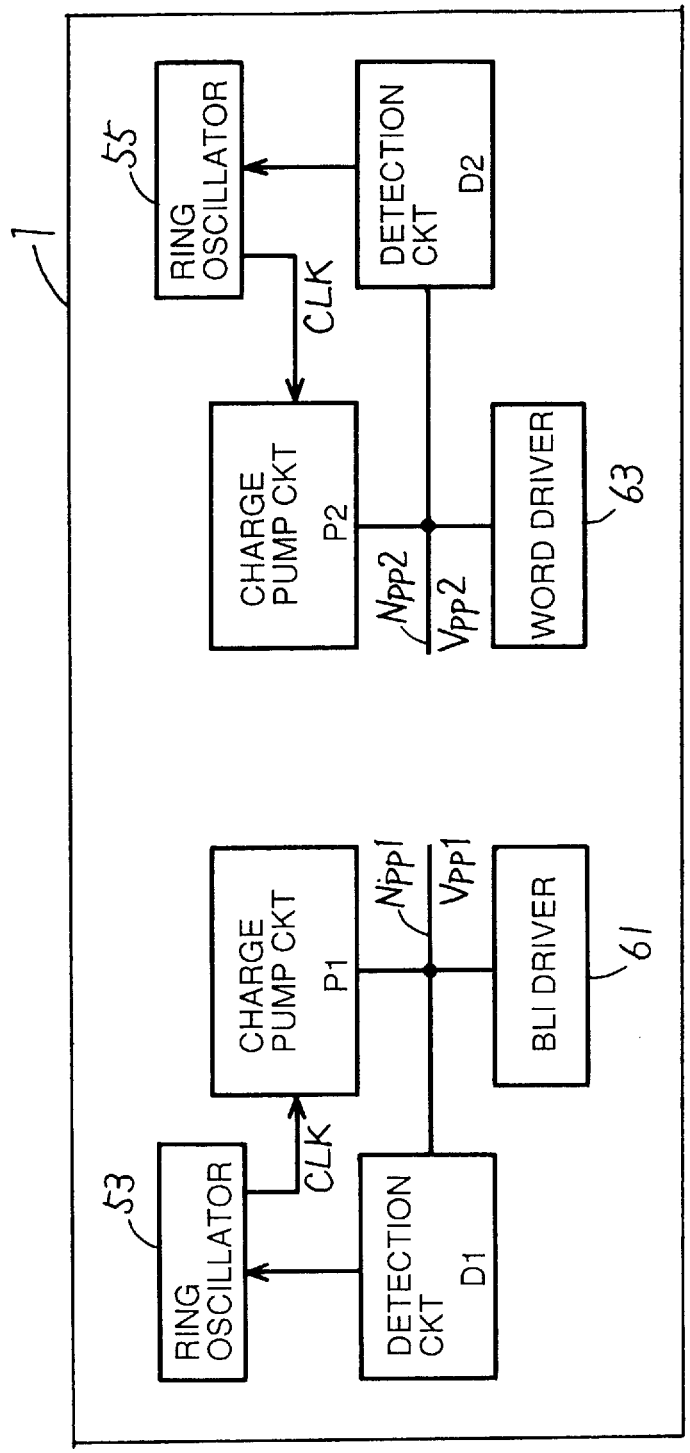
FIG. 10 is a schematic block diagram fragmentarily showing a DRAM of an embodiment 2 of the invention.

FIG. 10 is a schematic block diagram fragmentarily showing a DRAM of an embodiment 2. The general structure of the DRAM of the embodiment 2 is similar to that of the DRAM in FIG. 1. Portions similar to those in FIG. 2 bear the same reference numbers or characters, and will not be described below.

Referring to FIG. 10, a first boosted potential generating circuit is formed of detecting circuit D1, ring oscillator 53 and a charge pump circuit P1. A second boosted potential generating circuit is formed of detecting circuit D2, ring oscillator 55 and a charge pump circuit P2. These first and second boosted potential generating circuits form boosted potential generating unit 51 in FIG. 1. A portion of the DRAM shown in FIG. 10 differs from a portion of the DRAM in FIG. 2 in the structure relating to charge pump circuits. More specifically, charge pump circuits P1 and P2 in FIG. 10 have different structures, although charge pump circuits 57 and 59 in FIG. 2 have the same structure. The maximum value of boosted potential Vpp1 which charge pump circuit P1 in FIG. 10 can produce is smaller than the maximum value of boosted potential Vpp1 which charge pump circuit P2 in FIG. 10 can produce. Charge pump circuit P1 may have the same structure as that in FIG. 3. Charge pump circuit P2 may have the same structure as that in FIG. 4 or 6.

An operation will be briefly described below. Charge pump circuit P1 supplies boosted potential Vpp1 to BLI driver 61 in response to clock signal CLK sent from ring oscillator 53. Detecting circuit D1 serves to control ring oscillator 53 to maintain the boosted potential Vpp1 at the first level required by BLI driver 61. Charge pump circuit P2 supplies boosted potential Vpp2 to word driver 63 based on clock signal CLK sent from ring oscillator 55. Detecting circuit D2 controls the operation of ring oscillator 55 to maintain boosted potential Vpp2 at the second level required by word driver 63. The first level which is a reference for detection by detecting circuit D1 is smaller than the second level which is a reference for detection by detecting circuit D2.

As described above, the DRAM of the embodiment 2 is provided with the two boosted potential generating circuits (first and second boosted potential generating circuits) generating different boosted potentials, and the boosted potentials are supplied to two drivers (BLI driver 61 and word driver 63) requiring the boosted potentials at different levels. Similarly to the embodiment 1, therefore, BLI driver 61 can be supplied with the boosted potential at the required level, and it is not necessary to produce an unnecessarily large boosted potential to BLI driver 61. In the DRAM of the embodiment 2, therefore, waste of a current can be suppressed. Further, in the DRAM of the embodiment 2, since an unnecessarily large boosted potential is not produced, destruction of circuit elements (NMOS transistors 29 to 43 in FIG. 1) can be prevented, and thus reliability can be improved.

In the DRAM of the embodiment 2, the first boosted potential generating circuit is provided for BLI driver 61, and the second boosted potential generating circuit is provided for word driver 63. Therefore, the operation of the first boosted potential generating circuit is not affected by the operation of word driver 63, and the operation of the second boosted potential generating circuit is not affected by the operation of BLI driver 61.

(Embodiment 3)

A DRAM of an embodiment 3 relates to a DRAM of a low power supply potential. The power supply potential is, for example, 2V or less.

Figure 11:
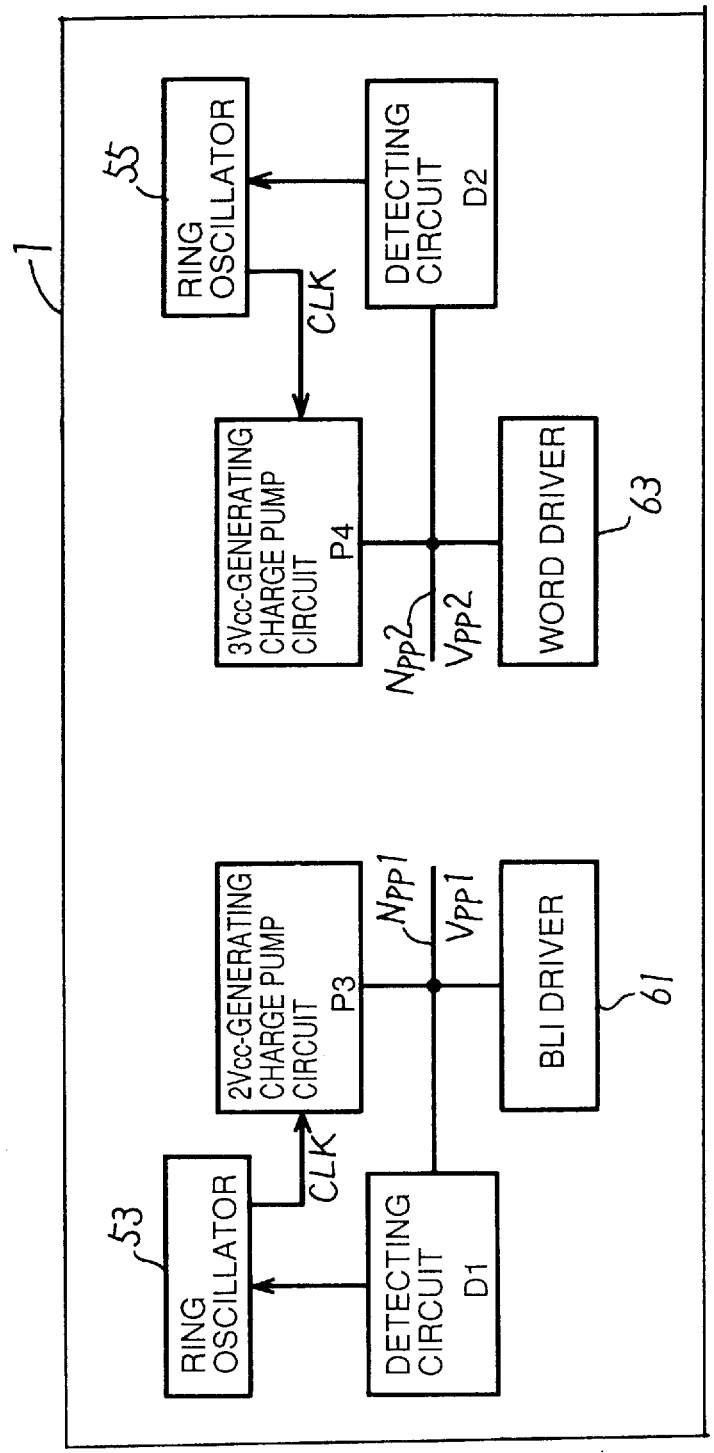
FIG. 11 is a schematic block diagram fragmentarily showing a DRAM of an embodiment 3 of the invention.

FIG. 11 is a schematic block diagram fragmentarily showing the DRAM of the embodiment 3. The general structure of the DRAM of the embodiment 3 is similar to that of the DRAM in FIG. 1. Portions similar to those in FIG. 2 bear the same reference numbers or characters, and will not be described below.

Referring to FIG. 11, a first boosted potential generating circuit is formed of detecting circuit D1, ring oscillator 53 and a 2Vcc-generating charge pump circuit P3. A second boosted potential generating circuit is formed of a detecting circuit D2, a ring oscillator 55 and a 3Vcc-generating charge pump circuit P4. These first and second boosted potential generating circuits form boosted potential generating unit 51 in FIG. 1. A portion of the DRAM shown in FIG. 11 differs from a portion of the DRAM in FIG. 2 in the structure relating to charge pump circuits. More specifically, in the structure shown in FIG. 2, charge pump circuit 57 of the first boosted potential generating circuit is the same as charge pump circuit 59 of the second boosted potential generating circuit. However, in the structure shown in FIG. 11, the charge pump circuit of the first boosted potential generating circuit is 2Vcc-generating charge pump circuit P3, and the charge pump circuit of the second boosted potential generating circuit is 3Vcc-generating charge pump circuit P4. 2Vcc-generating charge pump circuit P3 supplying boosted potential Vpp1 at 2Vcc level may be the same as the charge pump circuit shown in FIG. 3, 4 or 6. Referring to FIG. 11, an operation of the boosted potential generating unit will be briefly described below. 2Vcc-generating charge pump circuit P3 supplies boosted potential Vpp1 to BLI driver 61. Detecting circuit D1 controls the operation of ring oscillator 53 for maintaining boosted potential Vpp1 at the first level required by BLI driver 61. 3Vcc-generating charge pump circuit P4 supplies boosted potential Vpp2 to word driver 63 in accordance with clock signal CLK sent from ring oscillator 55. Detecting circuit D2 controls the operation of ring oscillator 55 to maintain boosted potential Vpp2 at the second level required by word driver 63. The first level which is a reference for detection by detecting circuit D1 is smaller than the second level which is a reference for detection by detecting circuit D2.

According to the DRAM of the embodiment 3, as described above, the boosted potentials at the levels which are required by BLI driver 61 and word driver 63 can be supplied to BLI driver 61 and word driver 63, respectively. Similarly to the embodiment 1, therefore, it is not necessary to produce an unnecessarily large boosted potential for BLI driver 61, so that waste of a current can be suppressed. Since an unnecessarily large boosted potential is not produced, destruction of circuit elements (NMOS transistors 29 to 43 in FIG. 1) can be prevented, and reliability can be improved. Since 3Vcc-generating charge pump circuit P4 can generate boosted potential Vpp2 at 3Vcc level, boosted potential Vpp2 at the level required by word driver 63 can be supplied even in the DRAM operating with a low power supply potential. In the DRAM of the embodiment 3, the above effects can be achieved even with a low power supply potential.

In the DRAM of the embodiment 3, the first boosted potential generating circuit is provided for BLI driver 61, and the second boosted potential generating circuit is provided for word driver 63. Therefore, the operation of the first boosted potential generating circuit is not affected by the operation of word driver 63, and the operation of the second boosted potential generating circuit is not affected by the operation of BLI driver 61.

Figure 12:
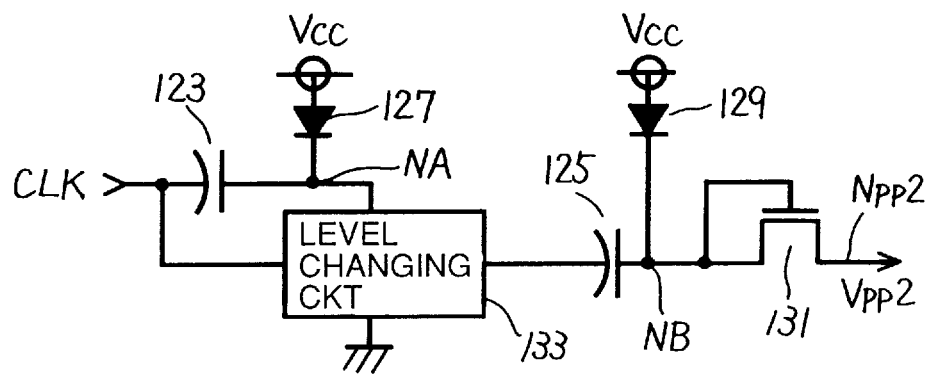
FIG. 12 is a circuit diagram specifically showing a 3Vcc-generating charge pump circuit P4 in FIG. 11.

FIG. 12 is a circuit diagram specifically showing 3Vcc-generating charge pump circuit P4 in FIG. 11. Portions similar to those in FIG. 11 bear the same reference numbers or characters, and will not be described below.

Referring to FIG. 12, 3Vcc-generating charge pump circuit P4 includes capacitors 123 and 125, diodes 127 and 129, an NMOS transistor 131 and a level changing circuit 133.

Capacitor 123 is connected between an input node for clock signal CLK and node NA. Diode 127 is connected between a node having power supply potential Vcc and node NA. Capacitor 125 is connected between an output node and node NB. Diode 129 is connected between the node having power supply potential Vcc and node NB. NMOS transistor 131 is connected between node NB and boosted potential node Npp2. NMOS transistor 131 has a gate connected to node NB. Level changing circuit 133 has the same structure as that in FIG. 5. Although the level changing circuit in FIG. 5 is connected between the node having boosted potential Vpp and the node having ground potential GND, level changing circuit 133 in FIG. 12 is connected between node NA and the node having ground potential GND. Node NA is at power supply potential Vcc level which has been set by diode 127 functioning as a precharge circuit. When clock signal CLK applied to capacitor 123 changes from ground potential GND level to power supply potential Vcc level, the potential on node NA attains 2Vcc level owing to the capacity coupling. Level changing circuit 133 which uses, as its power supply, node NA having a potential at 2Vcc level issues the potential at 2Vcc level to capacitor 125. This corresponds to widening of the amplitude of clock signal CLK having a magnitude between ground potential GND and power supply potential Vcc to a magnitude between ground potential GND and 2Vcc. By applying the potential of 2Vcc to capacitor 125, the potential on node NB, which has been precharged to power supply potential Vcc, attains 3Vcc. NMOS transistor 131 transmits the potential at 3Vcc level on node NB to boosted potential node Npp2. To be exact, there is an influence by threshold voltage Vthn of NMOS transistor 131, so that boosted potential node Npp2 receives the potential of 3Vcc−Vthn. By the above reasons, 3Vcc-generating charge pump circuit P4 can produce boosted potential Vpp2 of (3Vcc−Vthn) at the maximum.

Figure 13:
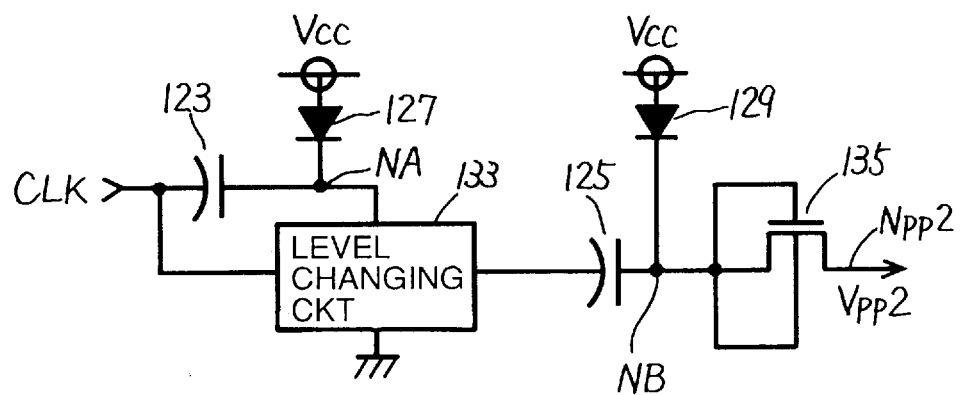
FIG. 13 is a circuit diagram specifically showing another example of the 3Vcc-generating charge pump circuit P4 in FIG. 11.

FIG. 13 is a circuit diagram specifically showing another example of 3Vcc-generating charge pump circuit P4 in FIG. 11. Portions similar to those in FIG. 12 bear the same reference numbers or characters, and will not be described below.

Referring to FIG. 13, an NMOS transistor 135 is connected between node NB and boosted potential node Npp2. NMOS transistor 135 has a gate connected to node NB. NMOS transistor 135 differs from NMOS transistor 131 in FIG. 12 in that NMOS transistor 135 employs a triple well structure. Since 3Vcc-generating charge pump circuit P4 in FIG. 13 employs NMOS transistor 135 of the triple well structure as described above, it is possible to reduce an influence which is caused by the threshold voltage at the time of transmission of the potential at 3Vcc level on node NB to boosted potential node Npp2, compared with the case where ordinary NMOS transistor 131 is employed as shown in FIG. 12. Thus, the maximum boosted potential Vpp2 which 3Vcc-generating charge pump circuit P4 in FIG. 13 can generate is larger than the maximum boosted potential Vpp2 in FIG. 12 which 3Vcc-generating charge pump circuit P4 can generate.

Figure 14:
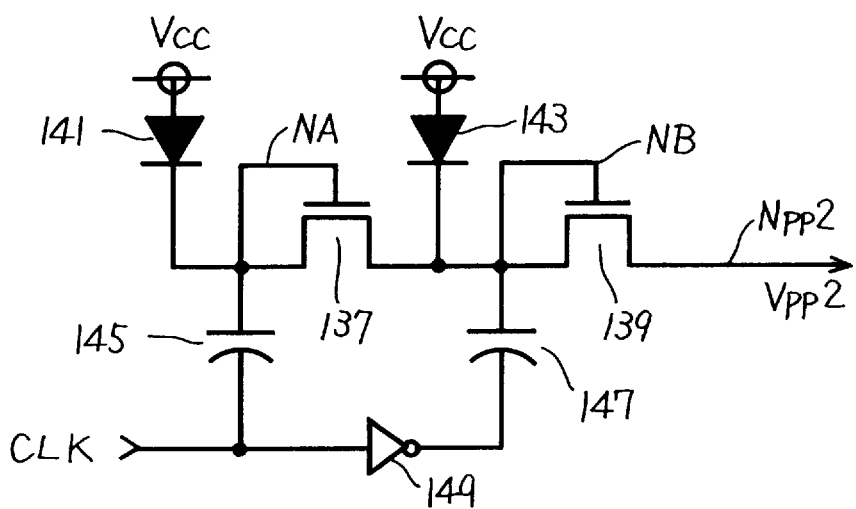
FIG. 14 is a circuit diagram specifically showing still another example of the 3Vcc-generating charge pump circuit P4 in FIG. 11.

FIG. 14 is a circuit diagram specifically showing still another example of 3Vcc-generating charge pump circuit P4 in FIG. 11. Portions similar to those in FIG. 11 bear the same reference numbers or characters, and will not be described below.

Referring to FIG. 14, 3Vcc-generating charge pump circuit P4 includes diodes 141 and 143, NMOS transistors 137 and 139, capacitors 145 and 147, and an inverter 149. Capacitor 145 is connected between node NA and an input node for clock signal CLK. Diode 141 is connected between a node having power supply potential Vcc and node NA. NMOS transistor 137 is connected between nodes NA and NB. NMOS transistor 137 has a gate connected to node NA. Diode 143 is connected between a node having power supply potential Vcc and node NB. NMOS transistor 139 is connected between node NB and boosted potential node Npp2. NMOS transistor 139 has a gate connected to node NB. Capacitor 147 is connected between node NB and an output node of inverter 149. Inverter 149 receives clock signal CLK on its input node.

Figure 15:
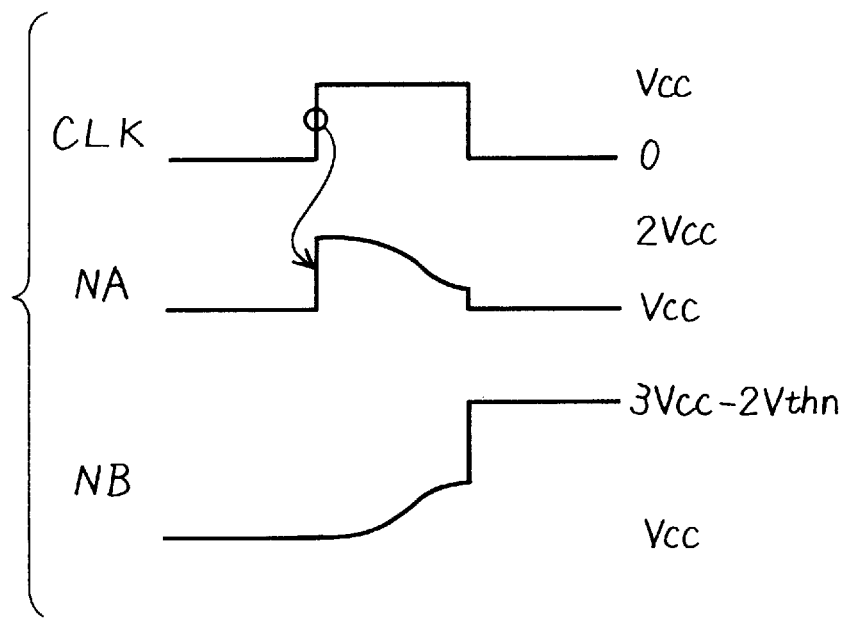
FIG. 15 is a timing chart showing an operation of the 3Vcc-generating charge pump circuit P4 in FIG. 14.

FIG. 15 is a timing chart showing an operation of 3Vcc-generating charge pump circuit P4 in FIG. 14.

Referring to FIGS. 14 and 15, an operation of the 3Vcc-generating charge pump circuit will be described below. Node NA has been precharged to power supply potential Vcc level by diode 141. When clock signal CLK changes from ground potential GND (0V) to power supply potential Vcc, the potential on node NA attains 2Vcc level owing to the capacity coupling. The potential at 2Vcc level on node NA is sent to node NB via NMOS transistor 137. Therefore, the potential on node NB which has been precharged to power supply potential Vcc level further rises therefrom to 2Vcc−Vthn. When clock signal CLK changes from power supply potential Vcc to ground potential GND (0V), the potential at the level of (2Vcc−Vthn) on node NB rises to the level of (3Vcc−Vthn) owing to the capacity coupling, because clock signal CLK is inverted by inverter 149. NMOS transistor 139 sends, as boosted potential Vpp2, the potential at the level of (Vcc−Vthn) on node NB to boosted potential node Npp. To be exact in view of threshold voltage Vthn, however, node Npp receives the potential at the level of (3Vcc−2Vthn), where Vthn represents a threshold voltage of transistor 137 or 139. 3Vcc-generating charge pump circuit P4 having the above structure can produce boosted potential Vpp2 at the level of (3Vcc−2Vthn) at the maximum.

An operation of 3Vcc-generating charge pump circuit in FIG. 14 can be summarized as follows. At node NA, first boosting is effected on power supply potential Vcc, and second boosting is effected at node NB, so that boosted potential Vpp2 at (3Vcc−Vthn) level is generated on boosted potential node Npp.

In the DRAM of the embodiment 3 described above, it is not necessary to generate an unnecessarily large boosted potential, so that waste of a current can be suppressed. Since an unnecessarily large boosted potential is not generated, destruction of a circuit can be prevented, and reliability can be improved.

(Embodiment 4)

An embodiment 4 relates to a DRAM using a wide power supply potential, and therefore employs wide power supply specifications. According to the wide power supply specifications, the power supply potential can be selected from a wide range, and the DRAM can operate with either the high or low power supply potential in this range.

When this DRAM of the wide power supply potential specification uses low power supply potential Vcc, a boosted potential generating circuit, which can generate the boosted potential at 2Vcc at the maximum, cannot generate a boosted potential at "H" level enough for the word line. When the DRAM of the wide power supply potential specification uses a high power supply potential, use of a boosted potential generating circuit, which generates the boosted potential of 3Vcc at the maximum, results in that an unnecessarily high boosted potential is produced as a potential at "H" level to be supplied to the word line. The DRAM of the embodiment 4 overcomes the above problems.

Figure 16:
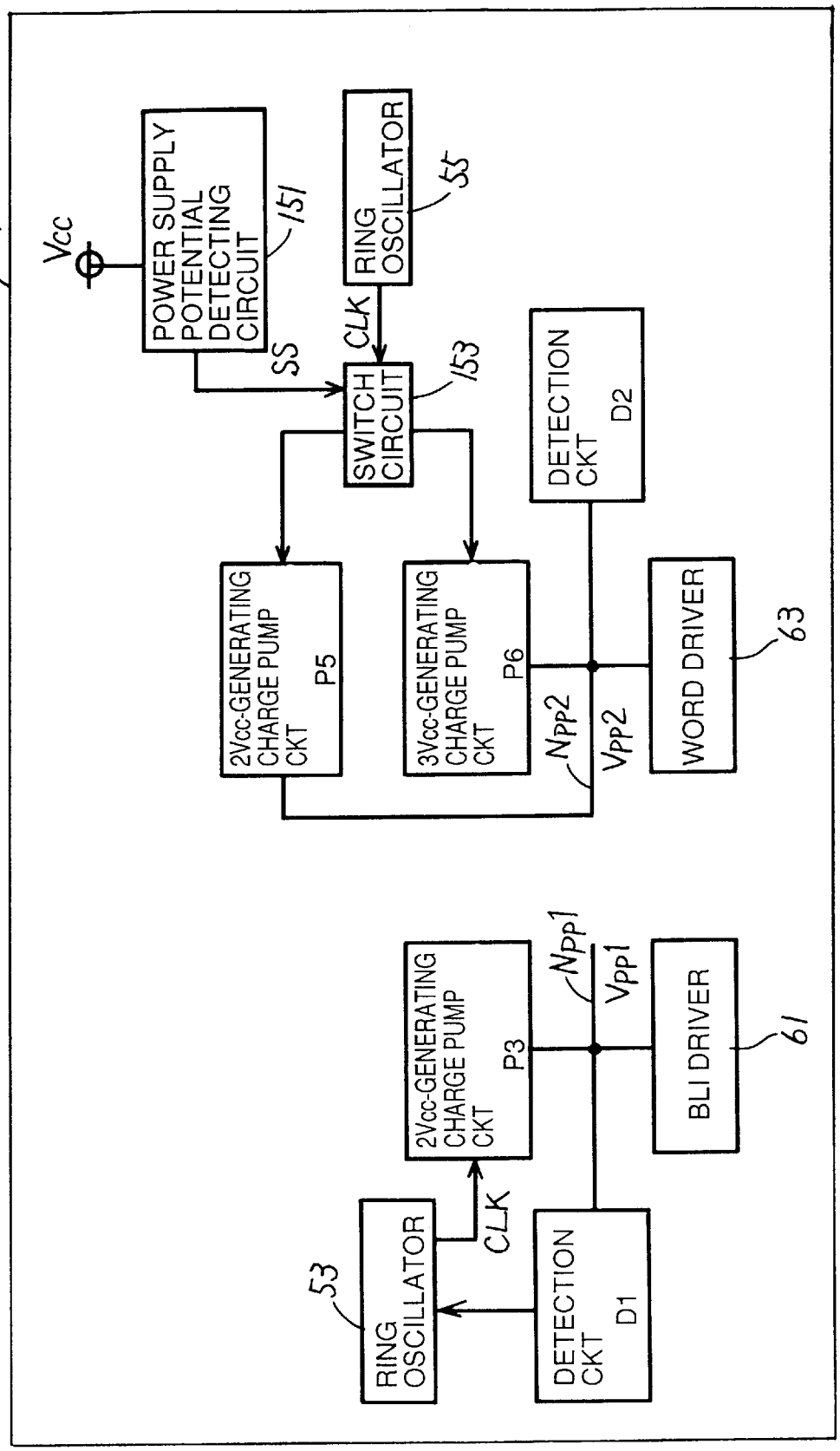
FIG. 16 is a schematic block diagram fragmentarily showing a DRAM of an embodiment 4 of the invention.

FIG. 16 is a schematic block diagram fragmentarily showing the DRAM of the embodiment 4. Portions similar to those in FIG. 11 bear the same reference numbers or characters, and will not be described below. A general structure of the DRAM of the embodiment 4 is similar to that of the DRAM in FIG. 1.

Referring to FIG. 16, the first boosted potential generating circuit is formed of detecting circuit D1, ring oscillator 53 and 2Vcc-generating charge pump circuit P3. The second boosted potential generating circuit is formed of detecting circuit D2, ring oscillator 55, a switch circuit 153, a power supply potential detecting circuit 151, a 2Vcc-generating charge pump circuit P5 and a 3Vcc-generating charge pump circuit P6. These first and second boosted potential generating circuits form boosted potential generating circuit 51 in FIG. 1.

Referring to FIG. 16, an operation will be described below. 2Vcc-generating charge pump circuit P3 issues boosted potential Vpp1 to BLI driver 61 based on clock signal CLK sent from ring oscillator 53. The detecting circuit D1 detects the potential level of boosted potential Vpp1, and controls ring oscillator 53 to maintain boosted potential Vpp1 at the first level required by BLI driver 61.

Power potential detecting circuit 151 detects the potential level of power supply potential Vcc. Depending the level of power supply potential, a switch signal SS at one of different levels is issued to switch circuit 153. Irrespectively of the operation mode of the DRAM, switch circuit 153 activates either 2Vcc-generating charge pump circuit P5 or 3Vcc-generating charge pump circuit P6 depending on switch signal SS. When the level of power supply potential Vcc detected by power supply potential detecting circuit 151 is smaller than the predetermined level, switch circuit 153 activates 3Vcc-generating charge pump circuit P6. When the level of power supply potential Vcc detected by power supply potential detecting circuit 151 is larger than the predetermined level, switch circuit 153 activates 2Vcc-generating charge pump circuit P5. 2Vcc-generating charge pump circuit P5 can generate boosted potential Vpp2 of 2Vcc at the maximum. 3Vcc-generating charge pump circuit P6 can generate boosted potential Vpp2 of 3Vcc at the maximum.

Boosted potential Vpp2 generated by either 2Vcc-generating charge pump circuit P5 or 3Vcc-generating charge pump circuit P6 is applied to word driver 63. Detecting circuit D2 detects the potential level of boosted potential Vpp2, and controls ring oscillator 55 to maintain boosted potential Vpp2 at the second level required by word driver 63. When 2Vcc-generating charge pump circuit P5 is to be operated, switch circuit 153 transmits clock signal CLK sent from ring oscillator 55 to 2Vcc-generating charge pump circuit P5. When 3Vcc-generating charge pump circuit P6 is to be operated, switch circuit 153 transmits clock signal CLK sent from ring oscillator 55 to 3Vcc-generating charge pump circuit P6. 2Vcc-generating charge pump circuit P5 may have the same structure as that shown in FIG. 3, 4 or 6. 3Vcc-generating charge pump circuit P6 may have the same structure as that shown in FIG. 12, 13 or 14.

In the DRAM having the above structure, the boosted potentials at levels required by BLI driver 61 and word driver 63 can be supplied to BLI driver 61 and word driver 63, respectively. Similarly to the embodiment 1, therefore, it is not necessary to produce an unnecessarily large boosted potential for BLI driver 61, so that waste of a current can be suppressed. Further, destruction of circuit elements (NMOS transistors 29 to 43 in FIG. 1) can be prevented, and reliability can be improved, because it is not necessary to produce an unnecessarily large boosted potential.

When power supply potential Vcc is small, 3Vcc-generating charge pump circuit P6 of a large capacity or performance can be used to produce a sufficient boosted potential. When power supply potential Vcc is large, 2Vcc-generating charge pump circuit P5 of a small performance operates and 3Vcc-generating charge pump circuit P6 of a large performance does not operate, so that an unnecessarily large boosted potential is not generated. Therefore, waste of a current can be suppressed.

In the DRAM of the embodiment 4, the first boosted potential generating circuit is provided for BLI driver 61, and the second boosted potential generating circuit is provided for word driver 63. Therefore, the operation of first boosted potential generating circuit is not influenced by the operation of word driver 63. Likewise, the operation of second boosted potential generating circuit is not influenced by the operation of BLI driver 61.

Figure 17:
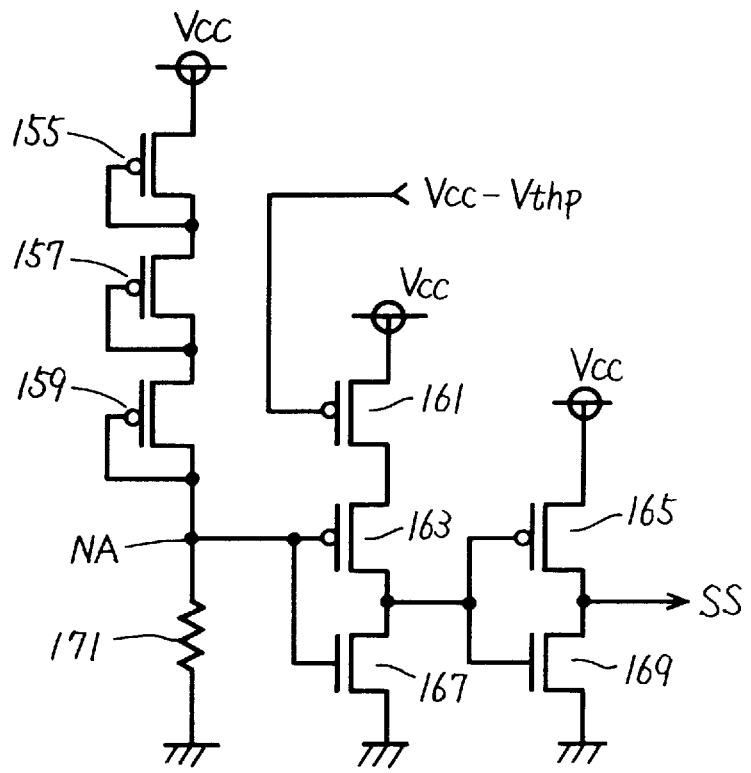
FIG. 17 is a circuit diagram specifically showing a power supply potential detecting circuit in FIG. 16.

FIG. 17 is a circuit diagram specifically showing power supply potential detecting circuit 151 in FIG. 16. Portions similar to those in FIG. 16 bear the same reference numbers or characters, and will not be described below.

Referring to FIG. 17, the power supply potential detecting circuit includes PMOS transistors 155, 157, 159, 161, 163 and 165, NMOS transistors 167 and 169, and a resistor element 171.

PMOS transistors 155, 157 and 159, and resistor element 171 are connected in series between a node having power supply potential Vcc and a node having ground potential GND. Each of PMOS transistors 155, 157 and 159 is diode-connected. PMOS transistors 161 and 163, and NMOS transistor 167 are connected in series between the node having power supply potential Vcc and the node having ground potential GND. PMOS transistor 161 receives on its gate a potential at a level of (Vcc−Vthp), where Vthp represents a threshold voltage of PMOS transistor 161. Gates of PMOS transistor 163 and NMOS transistor 167 are connected to node NA. PMOS transistor 165 and NMOS transistor 169 are connected in series between the node having power supply potential Vcc and the node having ground potential GND. Gates of PMOS transistor 165 and NMOS transistor 169 are connected to a drain of NMOS transistor 167. NMOS transistor 169 issues switch signal SS from its drain.

An operation will be described below. It is assumed that PMOS transistors 155 to 159 have a threshold voltage Vthp. When the potential level of power supply potential Vcc is higher than 3Vthp, node NA is charged. Thereby, PMOS transistor 163 is turned off, and NMOS transistor 167 is turned on. In response to this, PMOS transistor 165 is turned on, and NMOS transistor 169 is turned off. Therefore, when the potential level of power supply potential Vcc is larger than 3Vthp, switch signal SS at "H" level is issued to switch circuit 153 in FIG. 16. Switch circuit 153 activates 2Vcc-generating charge pump circuit P5. When the potential level of power supply potential Vcc is smaller than 3Vthp, node NA is not charged. Thereby, PMOS transistor 163 is turned on, and NMOS transistor 167 is turned off. In response to this, PMOS transistor 165 is turned off, and NMOS transistor 169 is turned on. Therefore, when the potential level of power supply potential Vcc is smaller than 3Vthp, switch signal SS at "L" level is issued to switch circuit 153 in FIG. 16. Switch circuit 153 activates 3Vcc-generating charge pump circuit P6.

Figure 18:
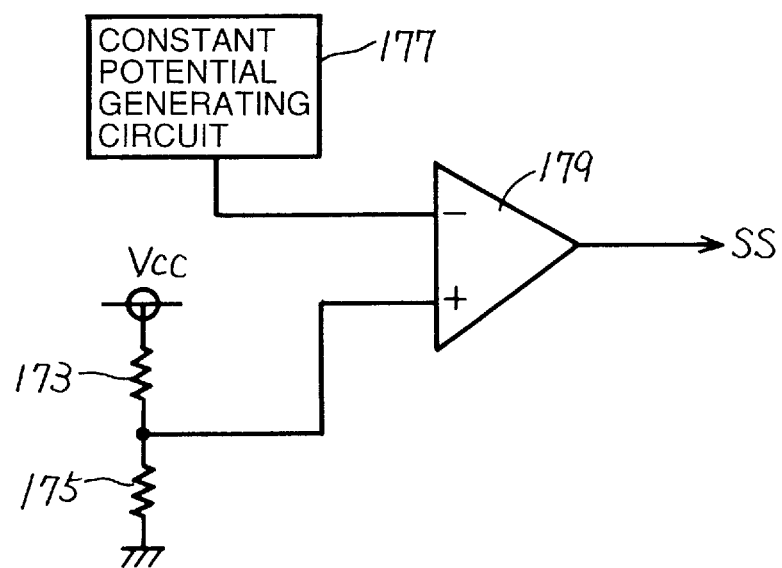
FIG. 18 is a circuit diagram specifically showing another example of the power supply potential detecting circuit in FIG. 16.

FIG. 18 is a circuit diagram specifically showing still another example of power supply potential detecting circuit 151 in FIG. 16. Portions similar to those in FIG. 16 bear the same reference numbers or characters, and will not be described below.

Referring to FIG. 18, the power supply potential detecting circuit includes a constant potential generating circuit 177, a current mirror circuit 179 and resistor elements 173 and 175. Resistor elements 173 and 175 form a level shifter circuit.

Constant potential generating circuit 177 applies a reference potential at a constant level to one of inputs of current mirror circuit 179. The level shifter circuit formed of resistor elements 173 and 175 shifts the level of power supply potential Vcc, and applies the same to the other input of current mirror circuit 179. Current mirror circuit 179 makes comparison between the reference potential sent from constant potential generating circuit 177 and the potential sent from the level shifter circuit formed of resistor elements 173 and 175. When the potential sent from the level shifter circuit is larger than the reference potential, current mirror circuit 179 issues the switch signal SS at "H" level to switch circuit 153 in FIG. 16. Thereby, switch circuit 153 activates 2Vcc-generating charge pump circuit P5. When the reference potential sent from constant potential generating circuit 177 is smaller the potential sent from the level shifter circuit formed of resistor elements 173 and 175, current mirror circuit 179 issues switch signal SS at "L" level to switch circuit 153 in FIG. 16. In response to this, switch circuit 153 activates 3Vcc-generating charge pump circuit P6.

Figure 19:
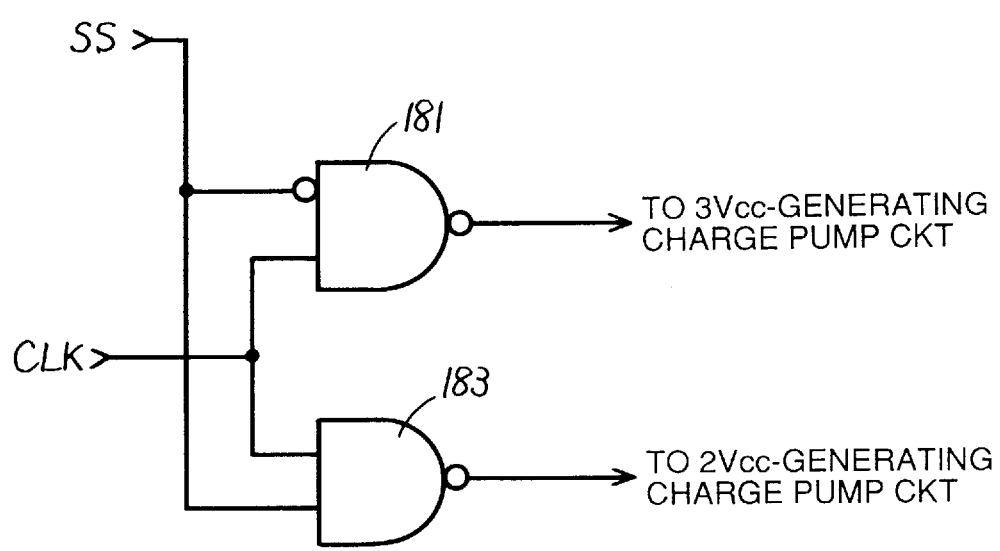
FIG. 19 is a circuit diagram specifically showing a switch circuit in FIG. 16.

FIG. 19 is a circuit diagram specifically showing switch circuit 153 in FIG. 16. In FIG. 19, the same reference numbers or characters denote portions similar to those in FIG. 16.

Referring to FIG. 19, the switch circuit includes a logic circuit 181 and an NAND circuit 183. Logic circuit 181 and NAND circuit 183 each are supplied on one of input nodes with switch signal SS sent from power supply potential detecting circuit 151 in FIG. 16. Clock signal CLK is supplied to the other input node of each of logic circuit 181 and NAND circuit 183.

When it is determined by power supply potential detecting circuit 151 that power supply potential Vcc is higher than a predetermined level, i.e., when switch signal SS at "H" level is applied to logic circuit 181 and NAND circuit 183, NAND circuit 183 transmits clock signal CLK to 2Vcc-generating charge pump circuit P5 in FIG. 16. When it is determined by power supply potential detecting circuit 151 that power supply potential Vcc is smaller than the predetermined level, switch signal SS at "L" level is applied to logic circuit 181 and NAND circuit 183. In this case, logic circuit 181 transmits clock signal CLK to 3Vcc-generating charge pump circuit P6 in FIG. 16.

In the DRAM of the embodiment 4 described above, it is not necessary to produce an unnecessarily large boosted potential, so that waste of a current can be suppressed. Further, destruction of circuit elements can be prevented, and reliability can be improved, because it is not necessary to produce an unnecessarily large boosted potential. It is possible to suppress waste of a current in the structure, which employs wide power supply specifications for switching the performance of charge pump circuit in accordance with the level of power supply potential Vcc.

(Embodiment 5)

Similarly to the DRAM of the embodiment 4, a DRAM of an embodiment 5 is related to a DRAM of wide power supply specifications.

Figure 20:
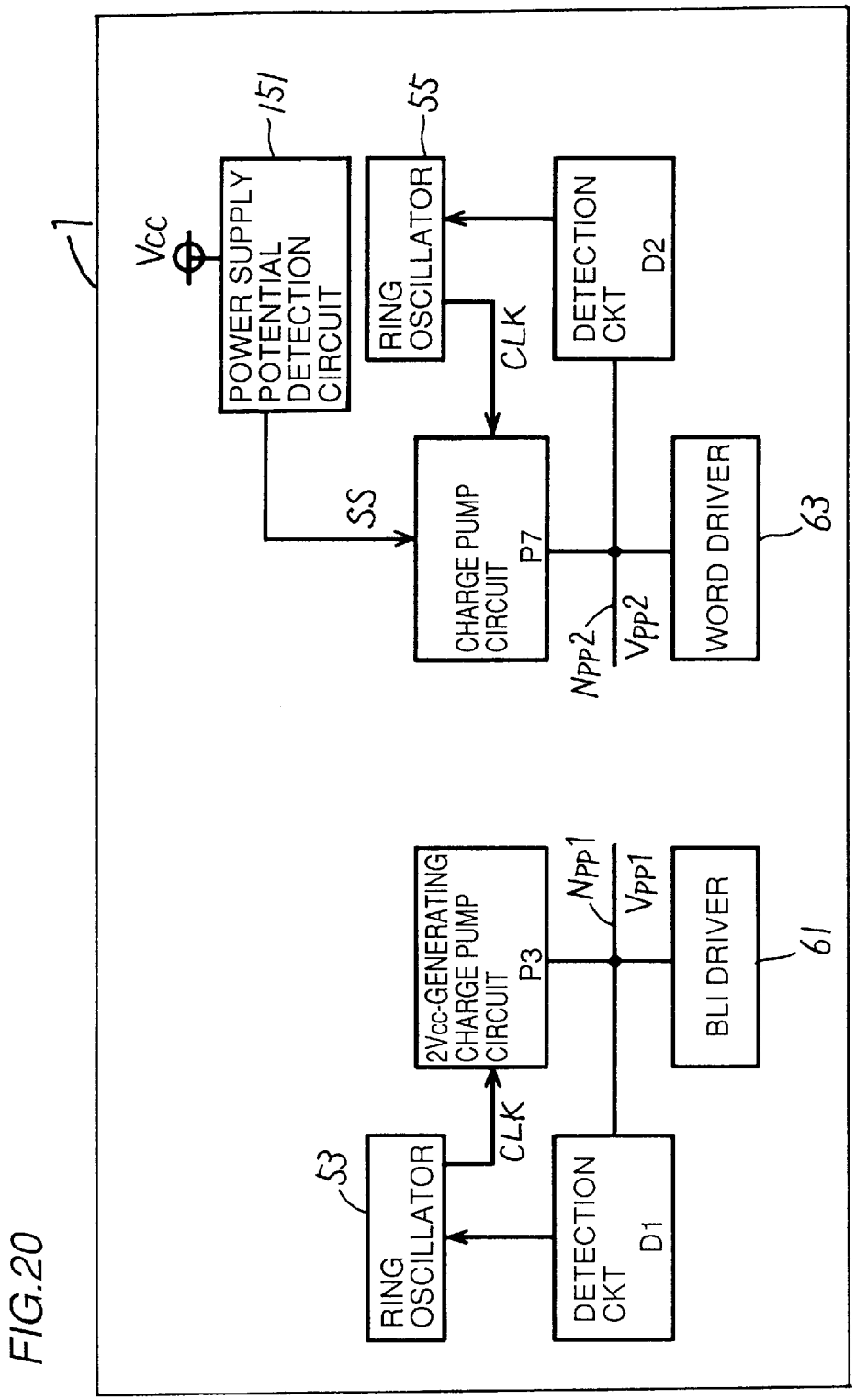
FIG. 20 is a schematic block diagram fragmentarily showing a DRAM of an embodiment 5 of the invention.

FIG. 20 is a schematic block diagram fragmentarily showing the DRAM of the embodiment 5. Portions similar to those in FIG. 16 bear the same reference numbers or characters, and will not be described below. A general structure of the DRAM of the embodiment 5 is similar to that of the DRAM in FIG. 1.

Referring to FIG. 20, a first boosted potential generating circuit is formed of detecting circuit D1, ring oscillator 53 and 2Vcc-generating charge pump circuit P3. A second boosted potential generating circuit is formed of detecting circuit D2, ring oscillator 55, a charge pump circuit P7 and power supply potential detecting circuit 151. These first and second boosted potential generating circuits form boosted potential generating unit 51 in FIG. 1.

An operation will be described below. 2Vcc-generating charge pump circuit P3 issues boosted potential Vpp1 to BLI driver 61 in response to clock signal CLK sent from ring oscillator 53. Detecting circuit D1 detects the potential level of boosted potential Vpp1, and controls the operation of ring oscillator 53 to maintain boosted potential Vpp1 at the first level required by BLI driver 61.

Power supply potential detecting circuit 151 may have the same structure as that in FIG. 17 or 18. When it is determined by the power supply potential detecting circuit 151 that the level of power supply potential Vcc is lower than a predetermined level, switch signal SS at "L" level is issued to charge pump circuit P7. Thereby, charge pump circuit P7 can issue boosted potential Vpp2 of 3Vcc at the maximum in accordance with switch signal SS at "L" level. When it is determined by power supply potential detecting circuit 151 that the level of power supply potential Vcc is higher than the predetermined level, switch signal SS at "H" level is issued to charge pump circuit P7. Thereby, charge pump circuit P7 can issue boosted potential Vpp2 at 2Vcc level at the maximum in accordance with switch signal SS at "H" level. The capability of charge pump circuit P7 is thus switched irrespectively of the operation mode. Charge pump circuit P7 issues boosted potential Vpp2 to word driver 63 in response to clock signal CLK sent from ring oscillator 55. Detecting circuit D2 detects the potential level of boosted potential Vpp2, and controls the operation of ring oscillator 55 to maintain boosted potential Vpp2 at the second level required by word driver 63.

According to the DRAM of the embodiment 5, as described above, the boosted potentials at the levels which are required by BLI driver 61 and word driver 63 can be supplied to BLI driver 61 and word driver 63, respectively. Similarly to the embodiment 1, therefore, it is not necessary to produce an unnecessarily large boosted potential for BLI driver 61, so that waste of a current can be suppressed. Since an unnecessarily large boosted potential is not produced, destruction of circuit elements (NMOS transistors 29 to 43 in FIG. 1) can be prevented, and reliability can be improved.

When power supply potential Vcc is small, the capacity or performance of the charge pump circuit is increased to produce the boosted potential at a sufficiently large level. When power supply potential Vcc is large, the performance of charge pump circuit is reduced, so that an unnecessarily large boosted potential cannot be generated. Therefore, waste of a current can be suppressed.

In the DRAM of the embodiment 5, the first boosted potential generating circuit is provided for BLI driver 61, and the second boosted potential generating circuit is provided for word driver 63. Therefore, the operation of first boosted potential generating circuit is not influenced by the operation of word driver 63, and the operation of second boosted potential generating circuit is not influenced by the operation of BLI driver 61.

Figure 21:
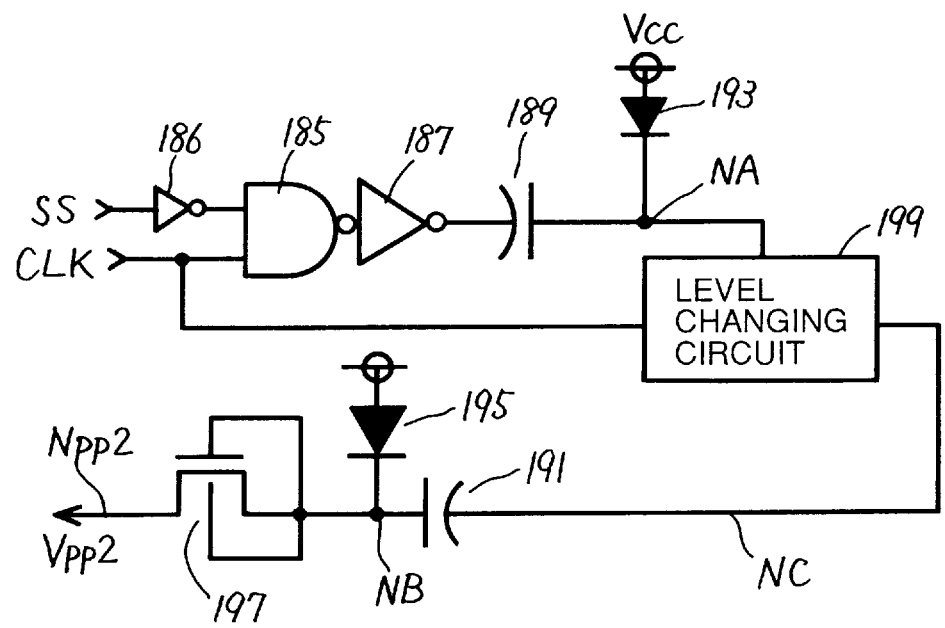
FIG. 21 is a circuit diagram specifically showing a charge pump circuit P7 in FIG. 20.

FIG. 21 is a circuit diagram specifically showing charge pump circuit P7 in FIG. 20. In FIG. 21, portions similar to those in FIG. 20 bear the same reference numbers or characters, and will not be described below.

Referring to FIG. 21, charge pump circuit P7 includes an NAND circuit 185, inverters 186 and 187, capacitors 189 and 191, diodes 193 and 195, a level changing circuit 199 and an NMOS transistor 197.

Inverter 186 receives, on one of its input nodes, switch signal SS sent from power supply potential detecting circuit 151 in FIG. 20. NAND circuit 185 is connected at one of its input nodes to an output node of inverter 186, and receives, on the other input node, clock signal CLK from ring oscillator 55 in FIG. 20. An output node of NAND circuit 185 is connected to an input node of inverter 187. Capacitor 189 is connected between the output node of inverter 187 and node NA. Diode 193 is connected between a node having power supply potential Vcc and node NA. Capacitor 191 is connected between nodes NB and NC. Diode 195 is connected between the node having power supply potential Vcc and node NB. NMOS transistor 197 is connected between boosted potential node Npp2 and node NB. A gate of NMOS transistor 197 is connected to node NB. NMOS transistor 197 has a triple well structure similar to that of NMOS transistor 135 in FIG. 13. Level changing circuit 199 is similar to the level changing circuit in FIG. 5. However, level changing circuit 199 in FIG. 21 uses the potential on node NA as the power supply potential, while the level changing circuit in FIG. 5 uses boosted potential Vpp as the power supply potential.

An operation will be described below. First, it is assumed that power supply potential detecting circuit 151 in FIG. 20 detects that power supply potential Vcc is smaller than the predetermined level, and issues switch signal SS at "L" level to inverter 186. This represents the case where a charge pump circuit issuing 2Vcc at the maximum cannot achieve a sufficient operation, because power supply potential Vcc is small. Node NA has been precharged to power supply potential Vcc level by diode 193 serving as a precharge circuit. Since inverter 186 is supplied with switch signal SS at "L" level, clock signal CLK is sent to capacitor 189. When clock signal CLK changes from ground potential GND to power supply potential Vcc, the potential on node NA changes from power supply potential Vcc level to 2Vcc level owing to the capacity coupling. Level changing circuit 199 uses, as the power supply, node NA having this potential at 2Vcc level, and issues the potential at 2Vcc level to capacitor 191. This corresponds widening of an amplitude of clock signal CLK, which is between ground potential GND and power supply potential Vcc, to a magnitude between ground potential GND and 2Vcc.

Since node NB has been precharged to power supply potential Vcc, the potential on node NB attains 3Vcc level owing to capacity coupling, when capacitor 191 is supplied with the potential at 2Vcc level. NMOS transistor 197 transmits the potential at 3Vcc level on node NB to boosted potential node Npp2. To be exact in view of threshold voltage Vthn of NMOS transistor 197, boosted potential node Npp2 is supplied with the potential of (3Vcc−Vthn). When power supply potential Vcc is small, and switch signal SS at "L" level is sent to inverter 186, charge pump circuit P7 can produce boosted potential Vpp2 of (3Vcc−Vthn) at the maximum.

The operation which is performed when the switch signal at "L" level is supplied can be summarized as follows. At node NA, first boosting is effected on power supply potential Vcc, and further, second boosting is effected at node NB, whereby boosted potential Vpp2 at (3Vcc−Vthn) level is-produced.

Then, description will be given on the case where power supply potential detecting circuit 151 in FIG. 20 detects that power supply potential Vcc is larger than the predetermined level, and issues switch signal SS at "H" level to charge pump circuit P7. In other words, description will be given on the case where power supply potential Vcc is large, and therefore it is required only to produce the boosted potential at 2Vcc level at the maximum. Inverter 186 receives switch signal SS at "H" level. Therefore, the output of NAND circuit 185 is fixed at "H" level regardless of the level of clock signal CLK. Accordingly, level changing circuit 199 uses, as its power supply, node NA having the potential at power supply potential Vcc level. Therefore, level changing circuit 199 issues the potential at power supply potential Vcc level to capacitor 191 when clock signal CLK changes from ground potential GND to power supply potential Vcc. The potential on node NB precharged to power supply potential Vcc level attains 2Vcc level owing to the capacity coupling. NMOS transistor 197 transmits the potential at 2Vcc level on node NB to boosted potential node Npp2. To be exact in view of threshold voltage Vthn of NMOS transistor 197, boosted potential node Npp2 is supplied with the potential of (2Vcc–Vthn). When power supply potential Vcc is large as described above, power supply potential detecting circuit 151 issues switch signal SS at "H" level to inverter 186, so that charge pump circuit P7 produces boosted potential Vpp2 at (2Vcc–Vthn) level at the maximum.

The operation which is performed when the switch signal at "H" level is supplied can be summarized as follows. The first boosting is effected on power supply potential Vcc at node NB, whereby boosted potential Vpp2 at (2Vcc–Vthn) level is issued.

Figure 22:
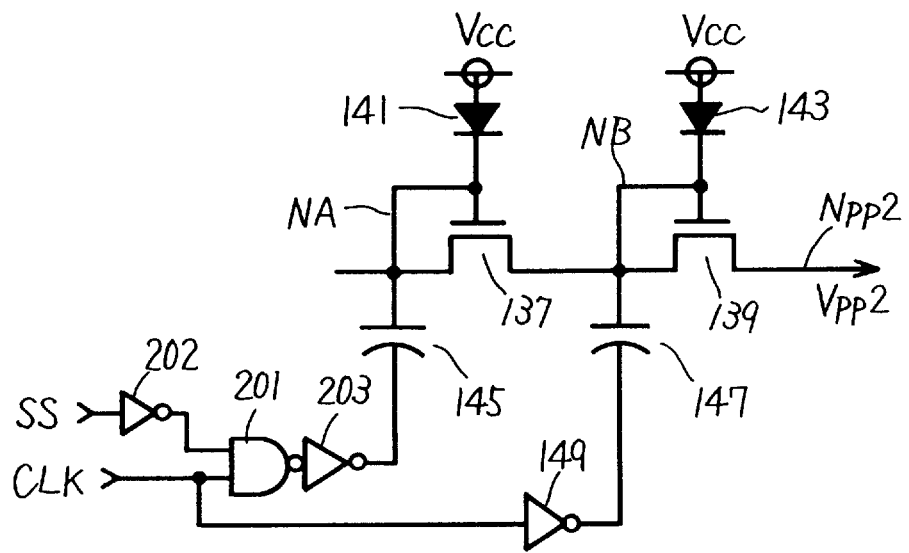
FIG. 22 is a circuit diagram specifically showing another example of a charge pump circuit P7 in FIG. 20.

FIG. 22 is a circuit diagram showing another example of charge pump circuit P7 in FIG. 20. Portions similar to those in FIG. 14 bear the same reference numbers or characters, and will not be described below.

Referring to FIG. 22, charge pump circuit P7 includes an NAND circuit 201, inverters 202, 203 and 149, capacitors 145 and 147, NMOS transistors 137 and 139, and diodes 141 and 143. Inverter 202 is supplied, on its input node, switch signal SS sent from power supply potential detecting circuit 151 in FIG. 20. One of input nodes of NAND circuit 201 is connected to an output node of inverter 202, and the other input node thereof is supplied with clock signal CLK from ring oscillator 55 in FIG. 20. An input node of inverter 203 is connected to an output node of NAND circuit 201, and an output node thereof is connected to capacitor 145.

Description will be given on the case where power supply potential detecting circuit 151 in FIG. 20 detects that the potential level of power supply potential Vcc is smaller than the predetermined level, and issues switch signal SS at "L" level to inverter 202. Since inverter 202 is supplied with switch signal SS at "H" level, change in level of clock signal CLK is transmitted to capacitor 145. Node NA has been precharged to power supply potential Vcc. Therefore, the potential on node NA attains 2Vcc level owing to the capacity coupling, when clock signal CLK changes from ground potential GND to power supply potential Vcc. In this case, NMOS transistor 137 is turned on to transmit the potential at (Vcc–Vthn) level from node NB to node NA. Thereby, the potential on node NB changes from power supply potential Vcc level to (2Vcc–Vthn) level, where Vthn represents a threshold voltage of NMOS transistor 137.

When clock signal CLK changes from power supply potential Vcc to ground potential GND, capacitor 147 is supplied with the potential at power supply potential Vcc level. Therefore, the potential at (2Vcc–Vthn) level on node NB changes into the potential at (3Vcc–Vthn) level owing to the capacity coupling. NMOS transistor 139 transmits the potential at (3Vcc–Vthn) level from node NB to boosted potential node Npp2. To be exact in view of threshold voltage Vthn of NMOS transistor 139, boosted potential node Npp2 receives the potential of 3Vcc–2Vthn. When power supply potential Vcc is small as described above, and inverter 202 is supplied with switch signal SS at "L" level, boosted potential Vpp2 of (3Vcc–2Vthn) at the maximum is produced.

The operation which is performed when switch signal SS at "L" level is issued can be summarized as follows. First boosting is effected on power supply potential Vcc at node NA, and second boosting is effected at node NB, so that boosted potential Vpp2 at (3Vcc–2Vthn) level is issued.

Description will be given on the case where power supply potential detecting circuit 151 in FIG. 20 detects that power supply potential Vcc is larger than the predetermined level, and switch signal SS at "H" level is sent to inverter 202. Since inverter 202 is supplied with switch signal SS at "L" level, the output of NAND circuit 201 is fixed at "H" level even when the level of clock signal CLK changes. Therefore, even when clock signal CLK changes from ground potential GND to power supply potential Vcc, the potential on node NB is at power supply potential Vcc level. When clock signal CLK changes from power supply potential Vcc to ground potential GND, capacitor 147 is supplied with the potential at power supply potential Vcc level. Therefore, the potential on node NB changes from power supply potential Vcc level to 2Vcc level owing to the capacity coupling. NMOS transistor 139 transmits the potential at 2Vcc level from node NB to boosted potential node Npp2. To be exact in view of threshold voltage Vthn of NMOS transistor 139, boosted potential node Npp2 is supplied with the potential of (2Vcc–Vthn). When power supply potential Vcc is large as described above, and switch signal SS at "H" level is supplied to inverter 202, charge pump circuit P7 issues boosted potential Vpp2 at (2Vcc–Vthn) level at the maximum.

The operation which is performed when switch signal SS at "H" level is supplied can be summarized as follows. By performing first boosting at node NB, boosted potential Vpp2 at (2Vcc–Vthn) level is produced.

According to the DRAM of the embodiment 5, as described above, it is not necessary to produce an unnecessarily large boosted potential, waste of a current can be suppressed. Since an unnecessarily large boosted potential is not produced, destruction of circuit elements can be prevented, and reliability can be improved. Since the number of times of boosting at charge pump circuit P7 is changed depending on the level of power supply potential Vcc, it is possible to produce the boosted potential at a necessary but unexcessive level, so that the wasteful consumption of a current can be suppressed even in the case of wide power supply specifications.

In the charge pump circuit shown in FIGS. 21 and 22, selection is made between one boosting operation and two boosting operations. However, charge pump circuit P7 in FIG. 20 is not restricted to this, and the structure may select N1 boosting operation(s) and N2 boosting operations for power supply potential Vcc, where N1 and N2 represent different natural numbers, respectively.

(Embodiment 6)

The overall configuration of a DRAM according to embodiment 6 is the same as the DRAM in FIG. 1. However, in the DRAM of embodiment 6, boosted potential generating unit 51 shown in FIG. 1 generates boosted potentials Vpp1, Vpp2 and Vpp3 at different levels.

Figure 23:
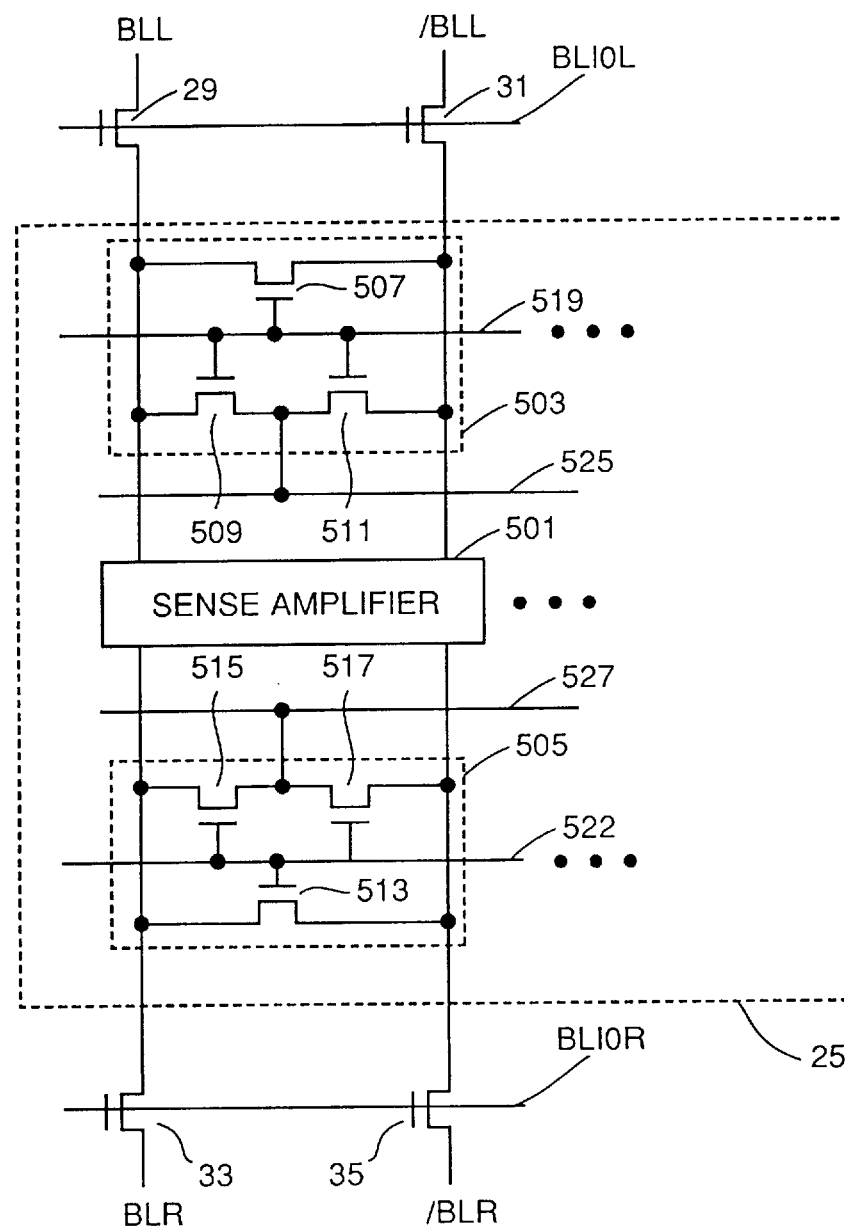
FIG. 23 is a circuit diagram specifically showing the sense amplifier row in FIG. 1.

FIG. 23 is a circuit diagram specifically showing sense amplifier row 25 in FIG. 1. The same portions as FIG. 1 are denoted with the same reference numerals and characters and will not be detailed here.

Referring to FIG. 23, though not entirely shown, sense amplifier row 25 includes a plurality of sense amplifiers 501, a plurality of equalize circuits 503 and a plurality of equalize circuits 505. Sense amplifier 501 is provided corresponding to a bit line pair BLL, /BLL and a bit line pair BLR, /BLR. Equalize circuit 503 is provided corresponding to bit line pair BLL, /BLL. The same applies to equalize circuit 505. Equalize circuit 503 is formed of NMOS transistors 507, 509 and 511, while equalize circuit 505 is formed of NMOS transistors 513, 515, and 517. Note that sense amplifier row 27 shown in FIG. 1 has a configuration identical to that of sense amplifier row 25.

In the DRAM, a precharge operation is conducted prior to memory cell operation, the potential of a bit line is initialized to ½ power supply potential Vcc (i.e., ½ Vcc). More specifically, with respect to equalize circuit 503 in FIG. 23, at the time of precharge operation, EQ line 519 is provided with an "H" level potential, and NMOS transistors 507 to 511 are turned on. A potential as high as ½ Vcc is provided to bit lines BLL, /BLL from precharge potential supply line 525. Herein, the operation of turning on NMOS transistors 507 to 511 and equalizing the potential of bit line BLL with the potential of bit line /BLL is called equalizing operation.

In a conventional DRAM, the potential to be applied to the gate of NMOS transistors 507 to 511 at the time of equalizing operation is at the Vcc level. However, the equalizing operation has become difficult as the DRAM came to be operated at lower voltage. More specifically, as the power supply potential Vcc of the DRAM is lowered, NMOS transistors 509 and 511 cannot be sufficiently turned on, which prevents the potential of ½ Vcc from being supplied to bit lines BLL, /BLL.

In the DRAM according to embodiment 6, a boosted potential is applied to EQ line 519 at the time of equalizing operation. The boosted potential applied to EQ line 519 at the time of equalizing operation is at (½ Vcc+Vthe) level when the threshold voltage of NMOS transistors 509, 511 is Vthe.

Figure 24:
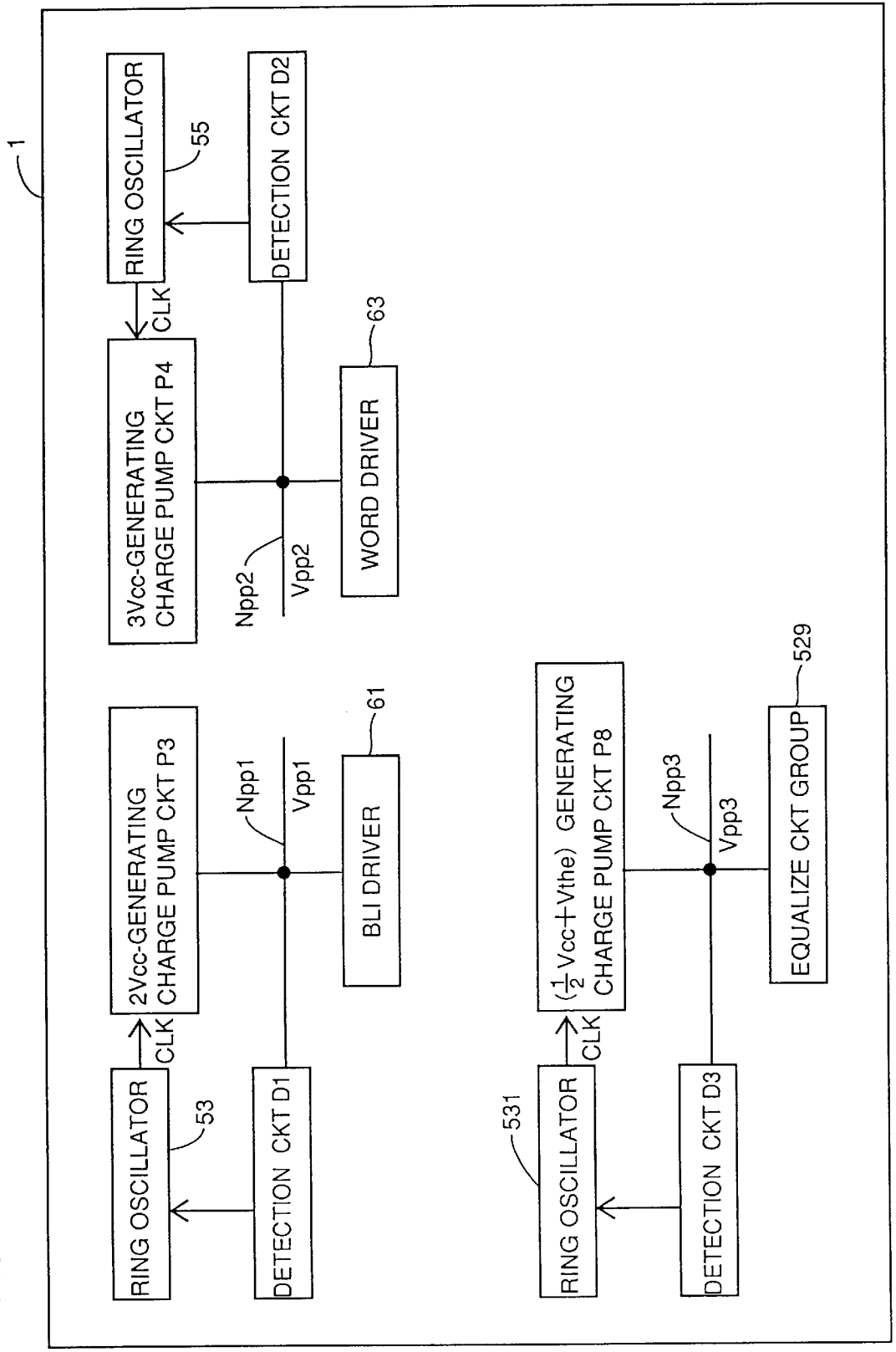
FIG. 24 is a block diagram schematically showing a DRAM of embodiment 6 according to the invention.

FIG. 24 is a block diagram schematically showing part of the DRAM according to embodiment 6. Note that the same portions as FIG. 11 are denoted with the same reference numerals and characters and will not be further detailed here. Referring to FIG. 24, the DRAM according to embodiment 6 includes a first boosted potential generating circuit formed of a detection circuit D1, a ring oscillator 53 and a 2Vcc-generating charge pump circuit P3, a second boosted potential generating circuit formed of a detection circuit D2, a ring oscillator 55 and a 3Vcc-generating charge pump circuit P4, a third boosted potential generating circuit formed of a detection circuit D3, a ring oscillator 531 and a (½ Vcc+Vthe)-generating charge pump circuit P8, a BLI driver 61, a word driver 63, and an equalizing circuit group 529.

The first, second and third boosted potential generating circuits constitute boosted potential generating unit 51 in FIG. 1. The DRAM in FIG. 24 includes the third boosted potential generating circuit as opposed to the DRAM in FIG. 11. Equalize circuit group 529 includes a plurality of equalize circuits, including for example equalize circuits 503 and 505 in FIG. 23.

The operation will be described. Detection circuit D3 detects the potential level of a boosted potential node Npp3 (line supplying boosted potential Vpp3 to equalize circuit group 529), operates ring oscillator 531 if boosted potential Vpp3 decreases to a third level, and stops the operation of ring oscillator 531 if boosted potential Vpp3 becomes higher than the third level. (½ Vcc+Vthe)-generating charge pump circuit P8 generates boosted potential Vpp3 on boosted potential node Npp3 based on a clock signal CLK from ring oscillator 531, if boosted potential Vpp3 decreases to the third level. (½ Vcc+Vthe)-generating charge pump circuit P8 can generate boosted potential Vpp3 at (½ Vcc+Vthe) level. Herein, Vthe is the threshold voltage of NMOS transistors constituting the equalize circuit. Note that the third level based on which detection circuit D3 conducts detection operation is set such that boosted potential Vpp3 can be maintained at a potential level required by equalize circuit group 529. The first level based on which detection circuit D1 performs detection operation is 2-Vcc level, the second level based on which detection circuit D2 performs detection operation is 3-Vcc level, and the third level based on which detection circuit D3 performs detection operation is (½ Vcc+Vthe)-level.

As described above, the first level based on which detection circuit D3 performs detection operation is smaller than the second level based on which detection circuit D2 performs detection operation. Furthermore, the third level based on which detection circuit D3 performs detection operation is smaller than the first level based on which circuit D1 performs detection operation. As a result, boosted potential Vpp1 is smaller than boosted potential Vpp2, while boosted potential Vpp3 is smaller than boosted potential Vpp1.

As described above, in the DRAM according to embodiment 6, three different boosted potential generating circuits generating boosted potentials at the three different levels (Vpp1, Vpp2, Vpp3) are provided. Therefore, the boosted potential Vpp1 at a level required by a BLI driver 61, in other words boosted potential Vpp1 large enough to be free from the influence of the threshold voltage at the time of turning on NMOS transistors 29 to 41 (FIG. 1) can be supplied to BLI driver 61. In addition, boosted potential Vpp2 at a level required by word driver 63, in other words, boosted potential Vpp2 large enough to be free from the threshold voltage at the time of turning on NMOS transistors constituting the memory cells may be supplied to word driver 63. Boosted potential Vpp3 at a level required by equalize circuit group 529, in other words boosted potential Vpp3 large enough to be free from the influence of the threshold voltage at the time of turning on the NMOS transistors constituting the equalize circuits may be supplied to equalize circuit group 529.

As described above, in the DRAM according to embodiment 6, boosted potentials at levels required by BLI driver 61, word driver 63, and equalize circuit group 529 may be supplied correspondingly. As a result, it is not necessary to generate a boosted potential larger than necessary, resulting in reduction of unnecessary consumption of current. In addition, since a boosted potential larger than necessary is not generated, the circuit elements (NMOS transistors 29 to 43 in FIG. 1 and NMOS transistors 507 to 517 in FIG. 23) may be prevented from breaking down, resulting in improved reliability. Also, in the DRAM according to embodiment 6, the first boosted potential generating circuit is provided relative to BLI driver 61, the second boosted potential generating circuit is provided relative to word driver 63, and the third boosted potential generating circuit is provided relative to equalize circuit group 529. As a result, the operation of the first boosted potential generating circuit is free from the influence of the operation of word driver 63 and equalize circuit group 529, the operation of the second boosted potential generating circuit is free from the influence of the operation of BLI driver 61 and equalize circuit group 529, and the operation of the third boosted potential generating circuit is free from the influence of the operation of BLI driver 61 and word driver 63.

In addition, since the DRAM according to embodiment 6 includes the entire configuration of DRAM according to embodiment 3, the same effects as those by the DRAM according to embodiment 3 may be provided.

Herein, in the DRAMs according to embodiments 1 to 5, a third boosted potential generating circuit formed of detection circuit D3, ring oscillator 531 and (½ Vcc+Vthe)-generating charge pump circuit P8 may be provided.

(Embodiment 7)

The overall configuration of a DRAM according to embodiment 7 is the same as the configuration of the DRAM according to embodiment 6 (FIG. 1). However, in the DRAM according to embodiment 7, boosted potential generating unit 51 as shown in FIG. 1 generates boosted potentials Vpp1, Vpp2, Vpp3, and Vpp4 at different levels.

Figure 25:
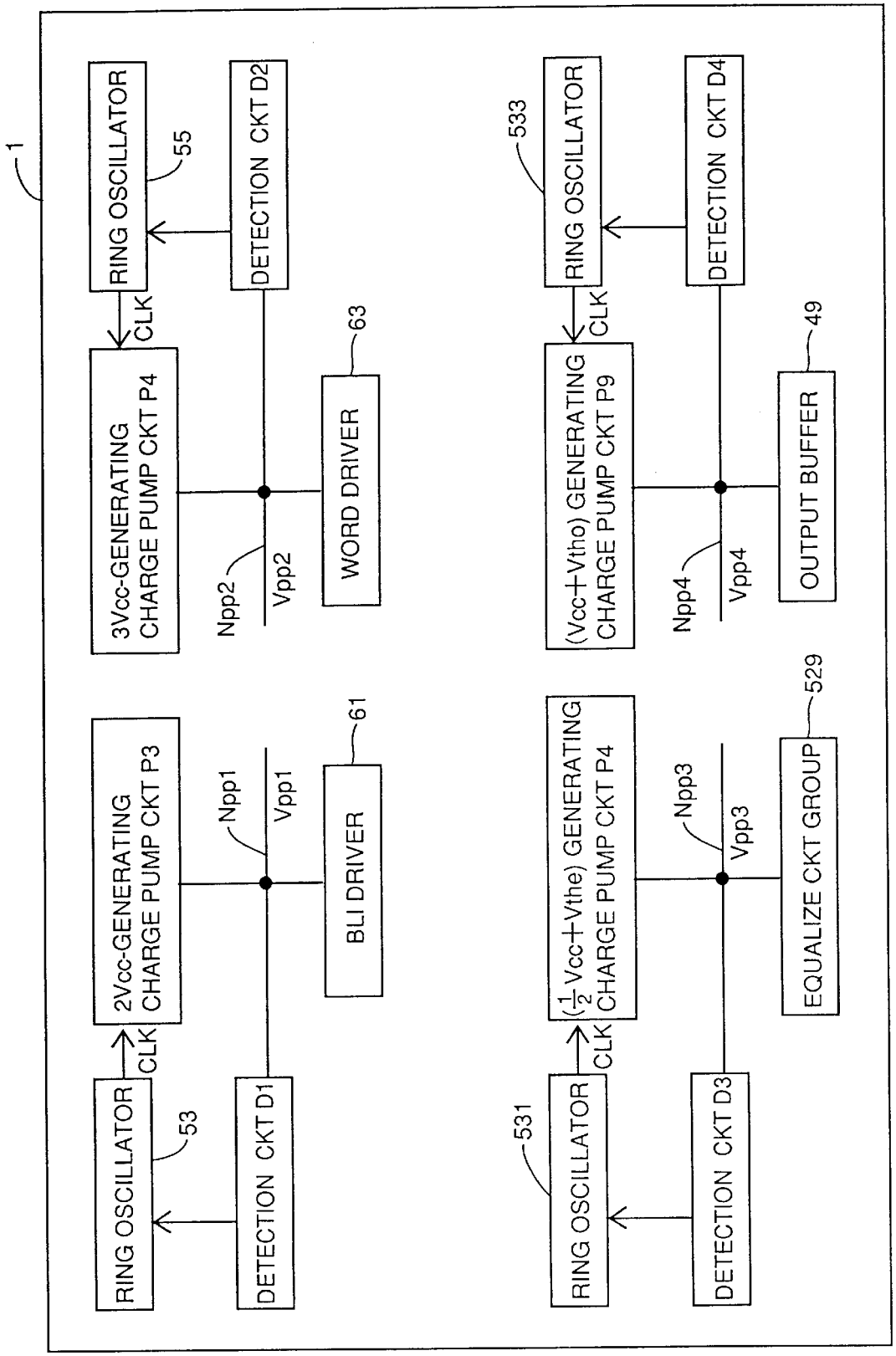
FIG. 25 is a block diagram schematically showing part of a DRAM of embodiment 7 according to the invention.

FIG. 25 is a block diagram schematically showing part of DRAM according to embodiment 7. Note that the same portions as those in FIGS. 1 and 24 are denoted with the same reference numerals and characters, and will not be further detailed here.

Referring to FIG. 25, the DRAM according to embodiment 7 includes a first boosted potential generating circuit formed of a detection circuit D1, a ring oscillator 53, and a 2Vcc-generating charge pump circuit P3, a second boosted potential generating circuit formed of a detection circuit D2, a ring oscillator 55, and a 3Vcc-generating charge pump circuit P4, a third boosted potential generating circuit formed of a detection circuit D3, a ring oscillator 531, and a (½ Vcc+Vthe)-generating charge pump circuit P8, and a fourth boosted potential generating circuit formed of a detection circuit D4, a ring oscillator 533, and a (Vcc+Vtho)-generating charge pump circuit P9, a BLI driver 61, a word driver 63, an equalize circuit group 529, and an output buffer 49. The first, second, third and fourth boosted potential generating circuits constitute boosted potential generating unit 51 as shown in FIG. 1. The DRAM shown in FIG. 25 includes the fourth boosted potential generating circuit as opposed to the DRAM shown in FIG. 24.

Now, the operation will be detailed. Detection circuit D4 detects the potential level of a boosted potential node Npp4 (line supplying boosted potential Vpp4 to output buffer 49), operates ring oscillator 533 if boosted potential Vpp4 is lowered to the fourth level, and stops the operation of ring oscillator 533 if boosted potential Vpp4 attains a level larger than the fourth level. Charge pump circuit P9 generates boosted potential Vpp4 on boosted potential node Npp4 in response to a clock signal CLK from ring oscillator 533 if boosted potential Vpp4 is lowered to the fourth level. (Vcc+Vtho)-generating charge pump circuit P9 can generate boosted potential Vpp4 at (Vcc+Vtho) level. Herein, Vtho is the threshold voltage of NMOS transistors constituting the peripheral circuits such as output buffer 49. The threshold voltage Vtho is larger than the threshold voltage Vthm of the NMOS transistors constituting the memory cells.

The fourth level based on which detection circuit D4 performs detection operation is set so that boosted potential Vpp4 can be maintained at a potential level required by output buffer 49. For example, the first level based on which detection circuit D1 performs detection operation is (Vcc+Vthm) level, the second level based on which detection circuit D2 performs detection operation is 3Vcc level, the fourth level based on which detection circuit D4 performs detection operation is (Vcc+Vtho) level. The four levels based on which detection is conducted by the four detection circuits D1 to D4 are thus different, and the four boosted potentials Vpp1 to Vpp4 applied to the four boosted potential nodes Npp1 to Npp4 have different levels.

Figure 26:
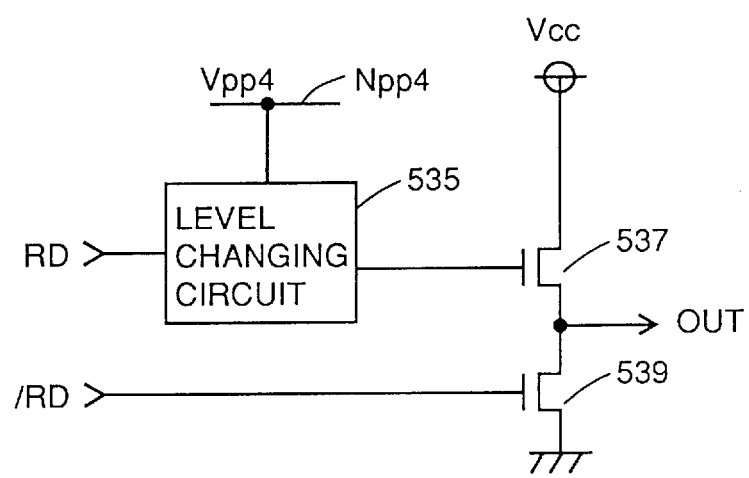
FIG. 26 is a circuit diagram specifically showing the output buffer shown in FIG. 1 according to embodiment 7.
Figure 27:
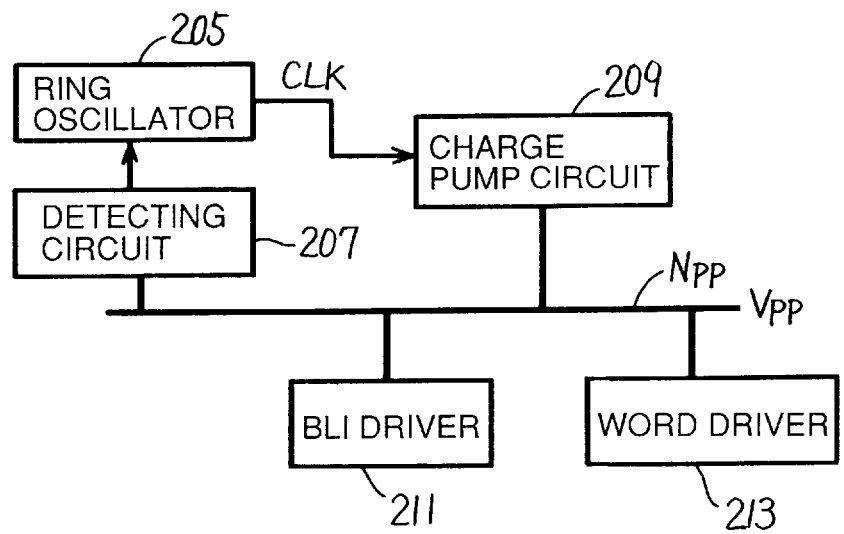
FIG. 27 is a schematic block diagram fragmentarily showing a conventional DRAM.
Figure 28:
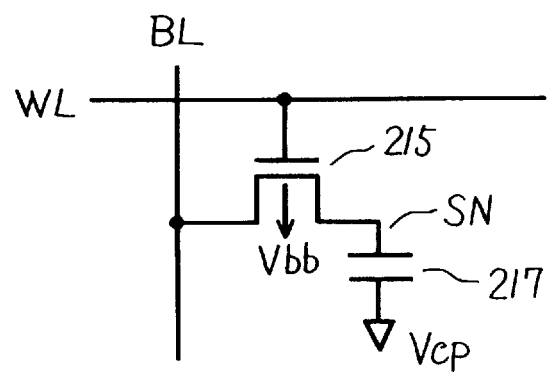
FIG. 28 is a circuit diagram specifically showing a memory cell of the conventional DRAM.
Figure 29:
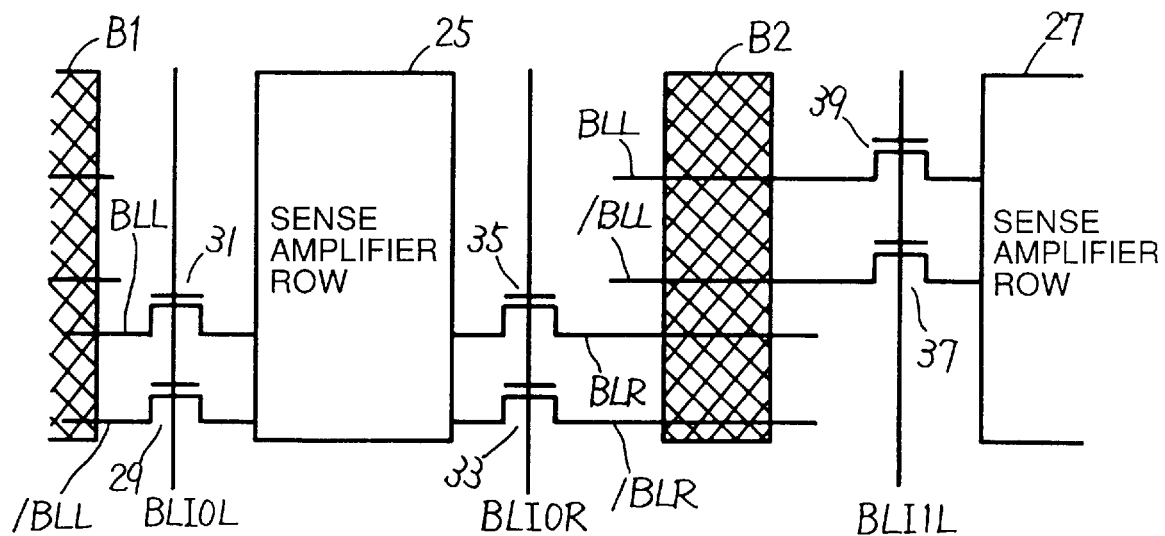
FIG. 29 is a schematic block diagram showing another portion of the conventional DRAM.
Figure 30:
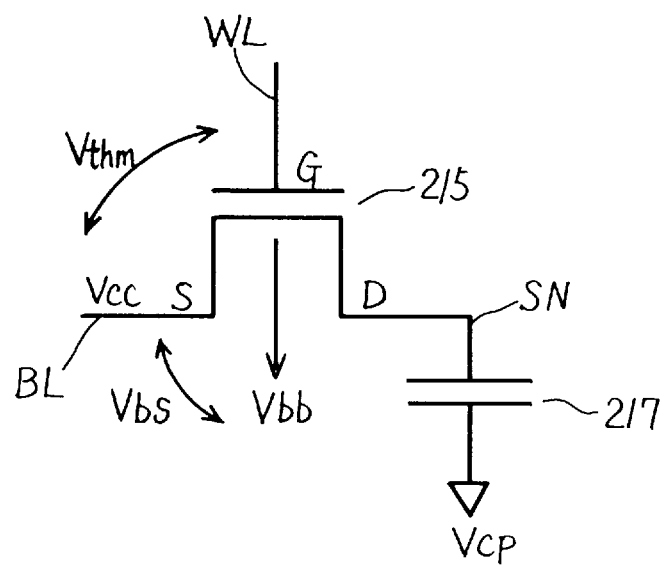
FIG. 30 is a circuit diagram specifically showing a memory cell for illustrating a first problem of the conventional DRAM.
Figure 31:
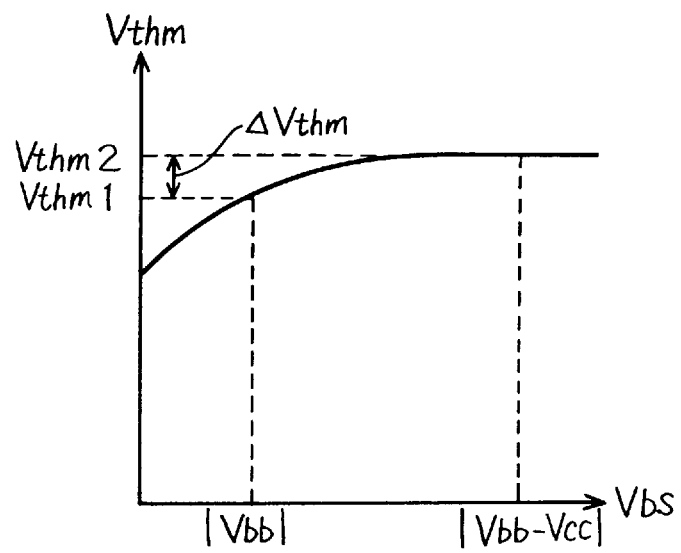
FIG. 31 shows a relationship between a back gate potential Vbs and a threshold voltage Vthm of an NMOS transistor used in a memory cell for illustrating the first problem of the conventional DRAM.
Figure 32:
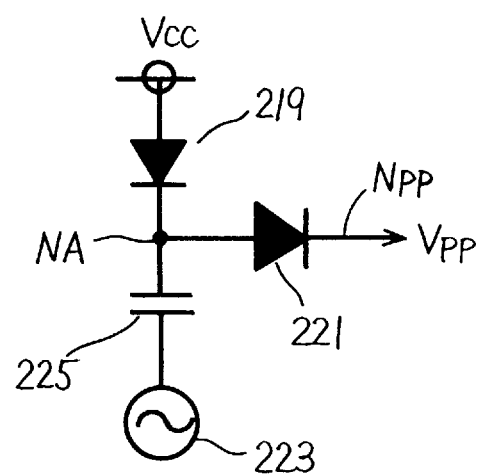
FIG. 32 is a circuit diagram showing a general boosted potential generating circuit for illustrating a second problem of the conventional DRAM.
Figure 33:
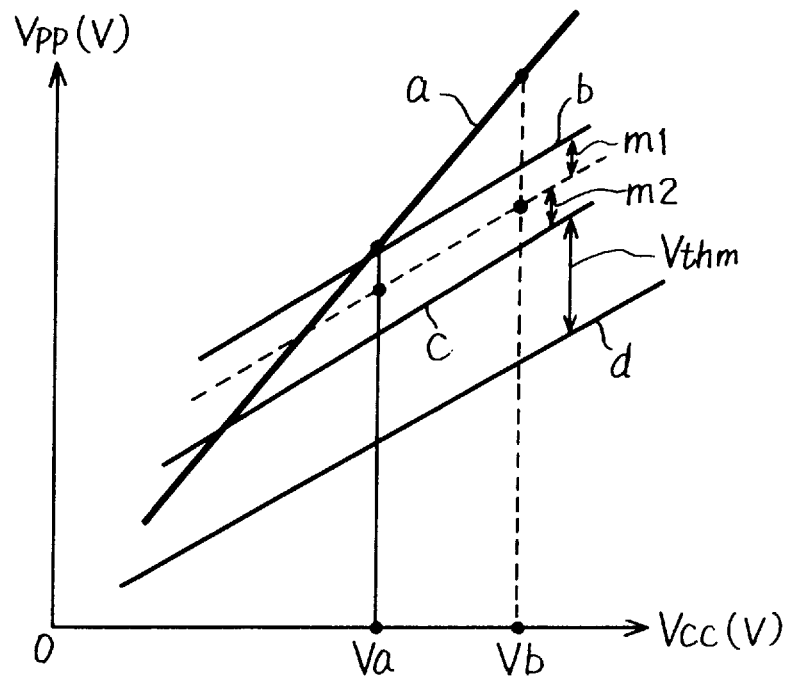
FIG. 33 shows a relationship between a power supply potential Vcc and a producible maximum boosted potential Vpp of the boosted potential generating circuit in FIG. 32 for illustrating the second problem of the conventional DRAM.
Figure 34:
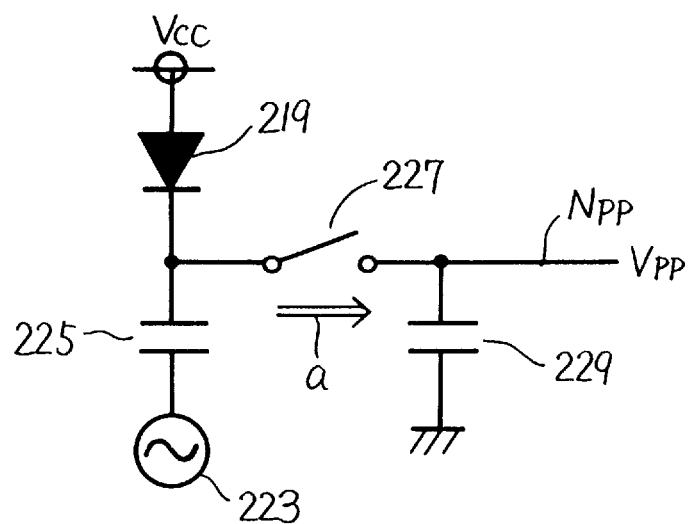
FIG. 34 shows a power supply for supplying a boosted potential Vpp for illustrating the second problem of the conventional DRAM.

FIG. 26 is a circuit diagram specifically showing output buffer 49 shown in FIG. 25. Referring to FIG. 26, output buffer 49 is formed of a level changing circuit 535, and NMOS transistors 537, 539. NMOS transistors 537 and 539 are connected in series between the node supplied with power supply potential Vcc and the node applied with ground potential. Level changing circuit 535 changes signal RD to Vpp4 level based on boosted potential Vpp4 if signal RD at Vcc level is input. The level-changed signal RD is applied to the gate of NMOS transistor 537. Signal /RD, the inverse of signal RD is applied to the gate of NMOS transistor 539. Note that the threshold voltage of NMOS transistors 537 is Vtho. Herein, level changing circuit 535 is the same as the level changing circuit shown in FIG. 5. However, in the DRAM according to embodiment 7, the sources of PMOS transistors 87, 89 in FIG. 5 are connected to node Npp4 (FIGS. 25, 26) supplied with boosted potential Vpp. Boosted potential Vpp4 is provided to the gate of NMOS transistor 537 in output buffer 49, in order to output a sufficiently "H" level signal to cope with a demand for a multi-bit configuration and high speed operation.

As described above, in the DRAM according to embodiment 7, the four different boosted potential generating circuits generating boosted potentials of the four different levels (Vpp1, Vpp2, Vpp3, Vpp4). Therefore, boosted potential Vpp1 at a level required by a BLI driver 61, in other words, boosted potential Vpp1 large enough to be free from the influence of the threshold voltage at the time of turning on NMOS transistors 29 to 43 (FIG. 1) may be supplied to BLI driver 61. In addition, boosted potential Vpp2 at a level required by word driver 63, in other words boosted potential Vpp2 large enough to be free from the influence of the first threshold voltage at the time of turning on NMOS transistors constituting the memory cells may be supplied to word driver 63. Furthermore, boosted potential Vpp3 at a level required by equalize circuit group 529, in other words boosted potential Vpp3 large enough to be free from the influence of the threshold voltage at the time of turning on the NMOS transistor constituting the equalize circuit may be supplied to equalize circuit group 529. Potential Vpp4 at a level required by output buffer 49, in other words boosted potential Vpp4 which permits a sufficiently "H" level signal to be output may be supplied to output buffer 49.

As described above, in the DRAM according to embodiment 7, the boosted potentials at levels required by BLI driver 61, word driver 63, equalize circuit group 529 and output buffer 49 can be supplied correspondingly. Therefore, it is not necessary to generate a boosted potential larger than necessary, thus restricting unnecessary consumption of current. Since a boosted potential larger than necessary is not generated, the circuit elements (NMOS transistors 29 to 43 in FIG. 1, NMOS transistors 503 to 517 in FIG. 23, and NMOS transistor 537 in FIG. 26) may be prevented from breaking down, resulting in improved reliability.

In the DRAM according to embodiment 7, the first boosted potential generating circuit is provided relative to BLI driver 61, the second boosted potential generating circuit is provided to word driver 63, the third boosted potential generating circuit is provided relative to equalize circuit group 529, and the fourth boosted potential generating circuit is provided relative to output buffer 49. The operation of the first boosted potential generating circuit is therefore free from the influence of word driver 63, equalize circuit group 529 and output buffer 49, the operation of the second boosted potential generating circuit is free from the influence of BLI driver 61, equalize circuit group 529, and output buffer 49, the operation of the third boosted potential generating circuit is free from the influence of BLI driver 61, word driver 63 and output buffer 49, and the operation of the fourth boosted potential generating circuit is free from the influence of BLI driver 61, word driver 63 and equalize circuit group 529. Since the DRAM according to embodiment 7 includes the entire configuration of DRAM according to embodiment 6, the same effects as those brought about by the DRAM according to embodiment 6 may be provided.

Note that in the DRAMs according to embodiments 1 to 5, the third boosted potential generating circuit formed of detection circuit D3, ring oscillator 531, and (½ Vcc +Vthe) -generating charge pump circuit P8, and the fourth boosted potential generating circuit formed of detection circuit D4, ring oscillator 533 and (Vcc+Vtho)-generating charge pump circuit P9 may additionally be provided.

Herein, a boosted potential generating circuit generating a boosted potential and a boosted potential node provided with the boosted potential (line supplying the boosted potential to internal circuitry) will be referred to as called "boosted power supply". In embodiments 1 to 7, the boosted power supplies are provided in 2, 3 or 4 systems, but the boosted power supplies in a plurality of systems more than 4 systems may be employed. In such a case, the levels of boosted potentials in all the boosted power supplies may be different or the same.

In addition, some of the plurality of boosted power supplies may be supplied with the same level boosted potential, while some of the plurality of boosted power supplies may be supplied with boosted potentials at different levels. Detection circuits for boosted power supply supplying the same level boosted potential are at the same detection level. In such a case, the capabilities of charge pump circuits in the boosted power supplies (the maximum boosted potential which can be generated by the charge pump circuit) may be the same or different. The detection levels by the detection circuits for the boosted power supplies supplying boosted potentials at different level are different. In such a case, the capabilities of charge pump circuits for the boosted power supplies may be the same or different. Any or all of the plurality of boosted power supplies may have their capabilities switched in response to the level of power supply potential Vcc (see FIGS. 16 and 20).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory, comprising:
    a plurality of internal circuits;
    a plurality of boosted potential supply lines provided corresponding to said plurality of internal circuits each for supplying a boosted potential to a corresponding one of said internal circuits; and
    a plurality of boosted potential generating means provided corresponding to said plurality of internal circuits each for generating a boosted potential to be applied to a corresponding one of said boosted potential supply lines, wherein
        each boosted potential generating means generates said boosted potential such that a potential level of the corresponding one of said boosted potential supply lines attains a potential level required by the corresponding one of said plurality of internal circuits.

2. The dynamic random access memory according to claim 1, wherein
    at least two of said plurality of boosted potential generating means generate said boosted potentials at substantially equal levels.

3. The dynamic random access memory according to claim 2, wherein
    said each boosted potential generating means includes a charge pump circuit for generating said boosted potential, wherein
    the capabilities of each charge pump circuit for generating said boosted potentials at substantially equal levels are substantially equal.

4. The dynamic random access memory according to claim 1, wherein
    at least two of said plurality of boosted potential generating means generate said boosted potentials at different levels.

5. The dynamic random access memory according to claim 4, wherein
    said each boosted potential generating means includes detection means for detecting the potential level of the corresponding one of said boosted potential supply lines and maintaining said boosted potential to be applied to the corresponding one of said boosted potential supply lines at a level required by said corresponding one of said internal circuits based on a predetermined detection level, wherein
        between said at least two of said plurality of boosted potential generating means for generating said boosted potentials at different levels, said predetermined detection levels are different.

6. The dynamic random access memory according to claim 5, wherein
    said each boosted potential generating means further includes a charge pump circuit for generating said boosted potential, wherein
    the capabilities of each charge pump circuit for generating said boosted potentials at different levels are substantially equal.

7. The dynamic random access memory according to claim 5, wherein
    said each boosted potential generating means further includes at least one charge pump circuit for generating said boosted potential, wherein
    the capabilities of each charge pump circuit of said at least two of said plurality of boosted potential generating means generating said boosted potentials at different levels are different.

8. The dynamic random access memory according to claim 7, wherein
    said each charge pump circuit of said each boosted potential generating means generates said boosted potential by performing a boosting operation to a power supply potential, wherein
        between said charge pump circuits for generating said boosted potentials at different levels, the numbers of times of performing said boosting operation are different from each other.

9. The dynamic random access memory according to claim 4, wherein
    at least one of said plurality of boosted potential generating means includes power supply potential detection means for detecting a level of a power supply potential, and the capability of said at least one of said plurality of boosted potential generating means including said power supply potential detection means is switched in response to a detection result by said power supply potential detection means.

10. The dynamic random access memory according to claim 9, wherein said at least one of said plurality of boosted potential generating means including said power supply potential detection means further includes a plurality of charge pump circuits for generating said boosted potentials, the capabilities of each charge pump circuit is different, and a charge pump circuit with a small capability is activated as said power supply potential takes a higher level, while another charge pump circuit with a large capability is activated as said power supply potential takes a lower level.

11. The dynamic random access memory according to claim 9, wherein said at least one of said plurality of boosted potential generating means including said power supply potential detection means further includes a charge pump circuit for generating said boosted potential, said charge pump circuit generates said boosted potential by performing a boosting operation to said power supply potential, and a number of said boosting operation is decreased as said power supply potential takes a higher level, while the number of said boosting operation is increased as said power supply potential takes a lower level.

12. A random access memory having a plurality of operation modes, comprising:

a first internal circuit;

a first boosted potential supply line for supplying a first boosted potential to said first internal circuit; and first boosted potential generating means for generating said first boosted potential to be applied to said first boosted potential supply line, wherein said first boosted potential generating means generates said first boosted potential such that said first boosted potential supply line attains a potential level required by said first internal circuit, said first boosted potential generating means includes first power supply potential detection means for detecting a level of a power supply potential, and the capability of said first boosted potential generating means to generate said first boosted potential is switched in response to a detection result by said first power supply potential detection means independently of what operation mode said random access memory is in.

13. The random access memory according to claim 12, wherein said first boosted potential generating means further includes a plurality of charge pump circuits for generating said first boosted potentials, each charge pump circuits has a different potential generating capability, and a charge pump circuit with a small potential generating capability is activated as said power supply potential takes a higher level, while another charge pump circuit with a large potential generating capability is activated as said power supply potential takes a lower level.

14. The random access memory according to claim 12, wherein said first boosted potential generating means includes a charge pump circuit for generating said first boosted potential, said charge pump circuit generates said first boosted potential by performing a boosting operation to said power supply potential, and a number of said boosting operation is decreased as said power supply potential takes a higher level, while the number of said boosting operation is increased as said power supply potential takes a lower level.

15. The dynamic random access memory according to claim 12, further comprising:

a second internal circuit;

a second boosted potential supply line for supplying a second boosted potential to said second internal circuit; and second boosted potential generating means for generating said second boosted potential to be applied to said second boosted potential supply line, wherein said second boosted potential generating means generates said second boosted potential such that said second boosted potential supply line attains a potential level required by said second internal circuit.

16. The random access memory according to claim 12, further comprising:

a plurality of second internal circuits;

a plurality of second boosted potential supply lines provided corresponding to said plurality of second internal circuits each for supplying a second boosted potential to a corresponding one of said second internal circuits; and a plurality of second boosted potential generating means provided corresponding to said plurality of second internal circuits each for generating said second boosted potential to be applied to a corresponding one of said second boosted potential supply lines wherein each second boosted potential generating means generates said second boosted potential such that the corresponding one of said second boosted potential supply lines attains a potential level required by the corresponding one of said plurality of second internal circuits.

17. The random access memory according to claim 15, wherein said second boosted potential generating means includes second power supply potential detection means for detecting the level of the power supply potential, and the capability of said second boosted potential generating means including said second power supply potential detection means to generate said second boosted potential is switched in response to a detection result by said second power supply detection means.

18. The random access memory according to claim 16, wherein at least one of said plurality of second boosted potential generating means includes second power supply potential detection means for detecting the level of the power supply potential, and the capability of generating said second boosted potential of said at least one of said plurality of second boosted potential generating means including said second power supply potential detection means is switched in response to a detection result by said second power supply detection means.

* * * * *